(12) United States Patent
Lu et al.

(10) Patent No.: US 11,128,320 B2
(45) Date of Patent: Sep. 21, 2021

(54) ENCODING METHOD, DECODING METHOD, ENCODING APPARATUS, AND DECODING APPARATUS

(71) Applicant: HUAWEI TECHNOLOGIES CO., LTD., Guangdong (CN)

(72) Inventors: Yuchun Lu, Beijing (CN); Liang Li, Beijing (CN); Lin Ma, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/998,560

(22) Filed: Aug. 20, 2020

(65) Prior Publication Data

US 2020/0382142 A1 Dec. 3, 2020

Related U.S. Application Data

(63) Continuation of application No. PCT/CN2019/121752, filed on Nov. 28, 2019.

(30) Foreign Application Priority Data

Dec. 5, 2018 (CN) .......................... 201811483003.X

(51) Int. Cl.
*H03M 13/29* (2006.01)
*H04L 1/00* (2006.01)
*H03M 13/15* (2006.01)

(52) U.S. Cl.
CPC ... *H03M 13/2906* (2013.01); *H03M 13/1515* (2013.01); *H04L 1/0045* (2013.01); *H04L 1/0057* (2013.01)

(58) Field of Classification Search
CPC .......... H03M 13/2906; H03M 13/1515; H04L 1/0045; H04L 1/0057
See application file for complete search history.

(56) References Cited

U.S. PATENT DOCUMENTS 5,606,569 A * 2/1997 MacDonald .......... H03M 13/09
                                                        714/758
5,973,625 A * 10/1999 Nam .................... H04N 5/9262
                                                         341/50

(Continued)

FOREIGN PATENT DOCUMENTS

CN       101667887 A       3/2010
CN       101702640 A       5/2010

(Continued)

OTHER PUBLICATIONS

Extended European Search Report issued in European Application No. 19892287.4 dated Mar. 18, 2021, 8 pages.

(Continued)

*Primary Examiner* — Kyle Vallecillo
(74) *Attorney, Agent, or Firm* — Fish & Richardson P.C.

(57) ABSTRACT

This application relates to the communications field, and discloses an encoding method, a decoding method, an encoding apparatus, and a decoding apparatus. The encoding method includes: receiving a data bitstream; performing forward error correction FEC encoding on the data bitstream to obtain X Reed-Solomon RS outer codes, where each of the X RS outer codes includes N1 symbols, K1 of the N1 symbols are payload symbols; and performing FEC encoding on the X RS outer codes to obtain Y RS inner codes, where each of the Y RS inner codes includes N2 symbols, K2 of the N2 symbols are payload symbols. According to this application, error correction performance of FEC decoding can be improved.

20 Claims, 13 Drawing Sheets

(56) References Cited

U.S. PATENT DOCUMENTS

| | | |
|---|---|---|
| 6,195,781 B1 | 2/2001 | Kosuge |
| 2006/0212776 A1* | 9/2006 | Koslov ............... H04L 1/0016 714/759 |
| 2006/0227901 A1* | 10/2006 | Gao .................... H04L 27/3466 375/340 |
| 2007/0011716 A1* | 1/2007 | Koslov ............... H04L 27/0008 725/135 |
| 2007/0025283 A1* | 2/2007 | Koslov ............... H04B 7/18517 370/316 |
| 2008/0212708 A1* | 9/2008 | Koslov ............... H04L 27/0014 375/286 |
| 2010/0223536 A1 | 9/2010 | Lee et al. |
| 2012/0246537 A1* | 9/2012 | Kubo ................. H03M 13/2909 714/752 |
| 2013/0028269 A1* | 1/2013 | Limberg ............. H04L 1/0071 370/474 |
| 2013/0028271 A1* | 1/2013 | Limberg ................ H04L 1/005 370/479 |
| 2013/0028336 A1* | 1/2013 | Limberg ............ H04N 21/2383 375/240.27 |
| 2014/0119458 A1* | 5/2014 | Limberg ............. H04L 1/0066 375/240.27 |
| 2014/0365848 A1* | 12/2014 | Roh ................. H03M 13/2966 714/784 |

FOREIGN PATENT DOCUMENTS

| | | |
|---|---|---|
| CN | 107925422 A | 4/2018 |
| WO | 2004095759 A2 | 11/2004 |

OTHER PUBLICATIONS

ITU-T G.709/Y.1331, "Series G: Transmission Systems and Media, Digital Systems and Networks; Interfaces for the optical transport network; Amendment 2," Jun. 2018, 256 pages.

ITU-T G.975, Telecommunication Standardization Sector of ITU, (Oct. 2000), Series G: Transmission Systems and Media, Digital Systems and Networks; Digital sections and digital line system—Optical fibre submarine cable systems; Forward error correction for submarine systems, Oct. 2000, 21 pages.

IEEE Std 802.3bs-2017, "IEEE Standard for Ethernet, Amendment 10: Media Access Control Parameters, Physical Layers, and Management Parameters for 200 Gb/s and 400 Gb/s Operation," Dec. 2017, 372 pages.

IEEE Std 802.3bj-2014, "IEEE Standard for Ethernet Amendment 2: Physical Layer Specifications and Management Parameters for 100 Gb/s Operation Over Backplanes and Copper Cables," Jun. 2014, 368 pages.

PCT International Search Report and Written Opinion issued in International Application No. PCT/CN2019/121752 dated Feb. 24, 2020, 12 pages (partial English translation).

* cited by examiner

| $C_{0,0}$ | $C_{0,2}$ | ... | $C_{0,31}$ |
|---|---|---|---|
| $C_{0,32}$ | $C_{0,33}$ | ... | $C_{0,63}$ |
| ... | ... | ... | ... |
| $C_{0,511}$ | $C_{0,512}$ | ... | $C_{0,543}$ |

FIG. 7

| $C_{0,0}$ | $C_{1,0}$ | $C_{0,1}$ | $C_{1,1}$ | ... | $C_{0,15}$ | $C_{1,15}$ |
|---|---|---|---|---|---|---|
| $C_{1,16}$ | $C_{0,16}$ | $C_{1,17}$ | $C_{0,17}$ | ... | $C_{1,31}$ | $C_{0,31}$ |
| ... | ... | ... | ... | ... | ... | ... |
| $C_{0,527}$ | $C_{1,527}$ | $C_{0,528}$ | $C_{1,528}$ | ... | $C_{0,543}$ | $C_{1,543}$ |

FIG. 8

| $C_{0,0}$ | $C_{1,0}$ | $C_{2,0}$ | $C_{3,0}$ | ... | $C_{0,7}$ | $C_{1,7}$ | $C_{2,7}$ | $C_{3,7}$ |
|---|---|---|---|---|---|---|---|---|
| $C_{1,8}$ | $C_{2,8}$ | $C_{3,8}$ | $C_{0,8}$ | ... | $C_{1,15}$ | $C_{2,15}$ | $C_{3,15}$ | $C_{0,15}$ |
| ... | ... | ... | ... | ... | ... | ... | ... | ... |
| $C_{3,535}$ | $C_{0,535}$ | $C_{1,535}$ | $C_{2,535}$ | ... | $C_{3,543}$ | $C_{0,543}$ | $C_{1,543}$ | $C_{2,543}$ |

FIG. 9

| $C_{0,0}$ | $C_{0,2}$ | ... | $C_{0,31}$ | $P_{0,0}$ | $P_{0,1}$ |
|---|---|---|---|---|---|
| $C_{0,32}$ | $C_{0,33}$ | ... | $C_{0,63}$ | $P_{1,0}$ | $P_{1,1}$ |
| ... | ... | ... | ... | ... | ... |
| $C_{0,511}$ | $C_{0,512}$ | ... | $C_{0,543}$ | $P_{16,0}$ | $P_{16,1}$ |

FIG. 10

| $C_{0,0}$ | $C_{1,0}$ | $C_{0,1}$ | $C_{1,1}$ | ... | $C_{0,15}$ | $C_{1,15}$ | $P_{0,0}$ | $P_{0,1}$ |
|---|---|---|---|---|---|---|---|---|
| $C_{1,16}$ | $C_{0,16}$ | $C_{1,17}$ | $C_{0,17}$ | ... | $C_{1,31}$ | $C_{0,31}$ | $P_{1,0}$ | $P_{1,1}$ |
| $C_{0,32}$ | $C_{1,32}$ | $C_{0,33}$ | $C_{1,33}$ | ... | $C_{0,47}$ | $C_{1,47}$ | $P_{0,0}$ | $P_{0,1}$ |
| $C_{1,48}$ | $C_{0,48}$ | $C_{1,49}$ | $C_{0,49}$ | ... | $C_{1,63}$ | $C_{0,63}$ | $P_{1,0}$ | $P_{1,1}$ |
| $C_{0,64}$ | $C_{1,64}$ | $C_{0,65}$ | $C_{1,65}$ | ... | $C_{0,79}$ | $C_{1,79}$ | $P_{0,0}$ | $P_{0,1}$ |
| $C_{1,80}$ | $C_{0,80}$ | $C_{1,81}$ | $C_{0,81}$ | ... | $C_{1,95}$ | $C_{0,95}$ | $P_{1,0}$ | $P_{1,1}$ |
| $C_{0,96}$ | $C_{1,96}$ | $C_{0,97}$ | $C_{1,97}$ | ... | $C_{0,111}$ | $C_{1,111}$ | $P_{0,0}$ | $P_{0,1}$ |
| $C_{1,112}$ | $C_{0,112}$ | $C_{1,113}$ | $C_{0,113}$ | ... | $C_{1,127}$ | $C_{0,127}$ | $P_{1,0}$ | $P_{1,1}$ |
| $C_{0,128}$ | $C_{1,128}$ | $C_{0,129}$ | $C_{1,129}$ | ... | $C_{0,143}$ | $C_{1,143}$ | $P_{0,0}$ | $P_{0,1}$ |
| ... | ... | ... | ... | ... | ... | ... | ... | ... |
| $C_{0,527}$ | $C_{1,527}$ | $C_{0,528}$ | $C_{1,528}$ | ... | $C_{0,543}$ | $C_{1,543}$ | $P_{33,0}$ | $P_{33,1}$ |

FIG. 11

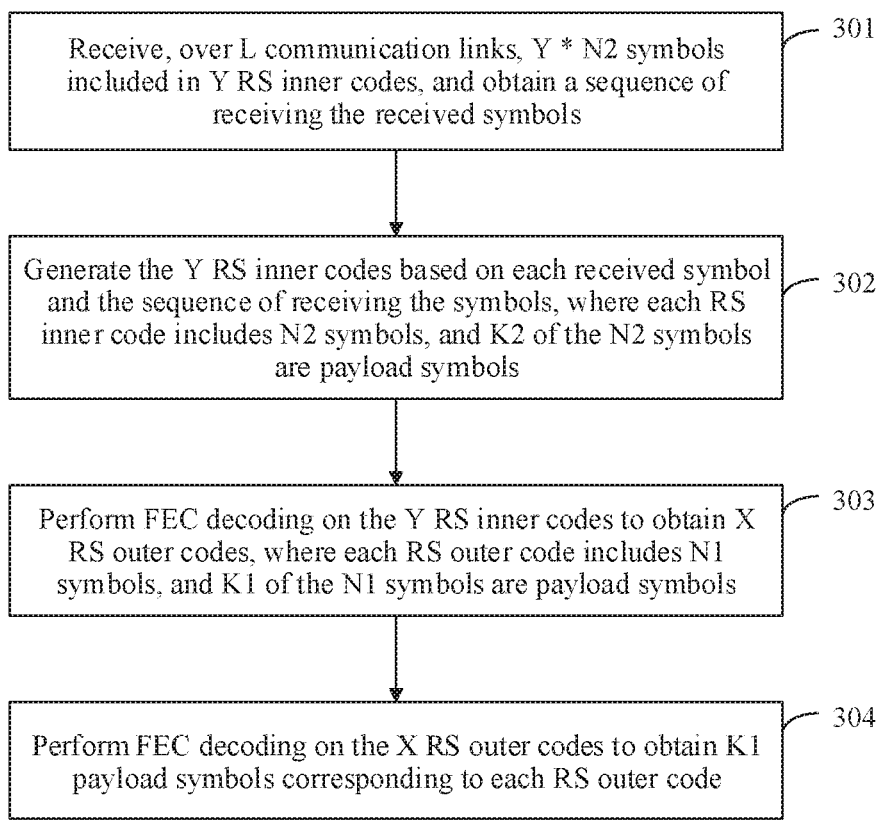

FIG. 12

Receive, over L communication links, Y * N2 symbols included in Y RS inner codes, and obtain a sequence of receiving the received symbols — 301

Generate the Y RS inner codes based on each received symbol and the sequence of receiving the symbols, where each RS inner code includes N2 symbols, and K2 of the N2 symbols are payload symbols — 302

Perform FEC decoding on the Y RS inner codes to obtain X RS outer codes, where each RS outer code includes N1 symbols, and K1 of the N1 symbols are payload symbols — 303

Perform FEC decoding on the X RS outer codes to obtain K1 payload symbols corresponding to each RS outer code — 304

FIG. 13

ENCODING METHOD, DECODING METHOD, ENCODING APPARATUS, AND DECODING APPARATUS

CROSS-REFERENCE TO RELATED APPLICATIONS

This application is a continuation of International Application No. PCT/CN2019/121752, filed on Nov. 28, 2019, which claims priority to Chinese Patent Application No. 201811483003.X, filed on Dec. 5, 2018. The disclosures of the aforementioned applications are hereby incorporated by reference in their entireties.

TECHNICAL FIELD

This application relates to the communications field, and in particular, to an encoding method, a decoding method, an encoding apparatus, and a decoding apparatus.

BACKGROUND

Rapid development of the internet brings explosive growth of data traffic. To relieve pressure of data transmission, a data transmission rate over a communication link needs to be continuously increased. As the data transmission rate is continuously increased, a channel transmission environment deteriorates, and consequently more serious damage is caused to data and a signal-to-noise ratio decreases. To mitigate adverse impact on data during communication, the data needs to be encoded before the data is sent.

Currently, data may be encoded by using a Reed-Solomon (RS) code. The RS code defines a codeword length N and an information length K, where N is greater than K. A transmit end may encode K to-be-sent first symbols at a time to obtain one codeword, where the codeword includes N encoded second symbols; and then send, to a receive end, the N second symbols that are included in the codeword. The receive end receives the N second symbols, and decodes the N second symbols. During decoding, if a quantity of symbols, on which errors occur, of the N second symbols in a transmission process does not exceed (N−K)/2, correction may be performed on the symbols on which errors occur, to recover the K first symbols.

Currently, after the codeword length N and the information length K are determined, a maximum of (N−K)/2 symbols on which errors occur can be corrected. In other words, error correction performance for symbols is determined. As a data transmission rate is continuously increased, error correction performance for symbols cannot meet a requirement currently. Therefore, error correction performance needs to be further improved.

SUMMARY

To improve error correction performance, embodiments of this application provide an encoding method, a decoding method, an encoding apparatus, and a decoding apparatus. Technical solutions are as follows.

According to a first aspect, this application provides an encoding method. The method includes: receiving a data bitstream; performing forward error correction FEC encoding on the data bitstream to obtain X Reed-Solomon RS outer codes, where each of the X RS outer codes includes N1 symbols, K1 of the N1 symbols are payload symbols, N1>K1, N1 and K1 are integers greater than 1, and X is an integer greater than 0; and performing FEC encoding on the X RS outer codes to obtain Y RS inner codes, where each of the Y RS inner codes includes N2 symbols, K2 of the N2 symbols are payload symbols, N2>K2, N2 and K2 are integers greater than 0, Y is an integer greater than 1, and N1>N2. After FEC encoding is performed on the data bitstream to obtain an RS outer code, second-time FEC encoding is further performed on the RS outer code to obtain an RS inner code. In this way, a quantity of symbols that can be corrected during decoding at a receive end can be increased, thereby improving error correction performance.

In a possible design, $Y=(X*N1)/K2$.

In a possible design, N1=544, K1=514, N2=34, and K2 or N1=544, K1=514, N2=36, and K2=34.

Optionally, when X is greater than or equal to 2, any two adjacent payload symbols in each RS inner code belong to different RS outer codes. Optionally, when X is greater than or equal to 2, any two adjacent payload symbols that belong to a same RS outer code and that are in each RS inner code are separated by (X−1) symbols. In this way, any two adjacent symbols transmitted over a communication link may belong to different RS outer codes and different RS inner codes, so that symbols on which errors occur are dispersed in different RS outer codes and different RS inner codes. This improves decoding performance.

In a possible design, for each of the Y RS inner codes. K2 payload symbols included in the RS inner code are determined; and FEC encoding is performed on the K2 payload symbols to obtain the RS inner code that includes N2 symbols.

In a possible design, for each of the K2 payload symbols, based on a number j of an RS outer code to which the payload symbol belongs and a number i of the payload symbol in the RS outer code j, a number h of an RS inner code to which the payload symbol belongs and a number c of the payload symbol in the RS inner code h are determined according to the following first formulas, where j=0, 1, . . . , X−1, and i=0, 1, . . . , N1−1, where the first formulas are: $h=\text{floor}((i*X+j)/K2)$ and $c=(i*X+j) \bmod K2$, where floor represents a rounding down operation, and MOD represents a modulo operation. In this way, when X is greater than 1, and two adjacent symbols in a same RS outer code may be mapped to a same RS inner code according to the first formulas, the two adjacent symbols are enabled to be separated by (X−1) symbols in the RS inner code.

In a possible design, the method further includes: sending, over L communication links, Y*N2 symbols included in the Y RS inner codes, where L is an integer greater than 0.

In a possible design, for symbols sent over a same communication link, any two adjacent symbols belong to different RS inner codes. Optionally, for symbols sent over a same communication link, any two adjacent symbols that belong to a same RS inner code are separated by (D−1) symbols, where D is an integer greater than 1, and D<Y. In this way, two adjacent symbols transmitted over the communication link may belong to different RS inner codes.

According to a second aspect, this application provides a decoding method. The method includes: receiving Y Reed-Solomon RS inner codes, where each of the Y RS inner codes includes N2 symbols, K2 of the N2 symbols are payload symbols, N2 K2, N2 and K2 are integers greater than 0, and Y is an integer greater than 1; performing forward error correction FEC decoding on the Y RS inner codes to obtain X RS outer codes, where each of the X RS outer codes includes N1 symbols, K1 of the N1 symbols are payload symbols, N1>K1, N1>N2, N1 and K1 are integers greater than 1, and X is an integer greater than 0; and performing FEC decoding on the X RS outer codes to obtain K1 payload symbols corresponding to each RS outer code. In this way, after FEC decoding is performed on an RS inner code to obtain a payload symbol in the RS inner code, then an RS outer code is formed based on the payload symbol in the RS inner code, and then second-time FEC decoding is further performed on the RS outer code. In this way, a quantity of symbols that can be corrected during decoding can be increased, thereby improving error correction performance.

In a possible design, $X=(Y*K2)/N1$

In a possible design, N1=544, K1=514, N2=34, and K2=32; or N1=544, K1=514, N2=36, and K2=34.

In a possible design, when X is greater than or equal to 2, any two adjacent payload symbols in each RS inner code belong to different RS outer codes. Optionally, when X is greater than or equal to 2, any two adjacent payload symbols that belong to a same RS outer code and that are in each RS inner code are separated by (X−1) symbols. In this way, any two adjacent symbols transmitted over the communication link belong to different RS outer codes and different RS inner codes, so that symbols on which errors occur are dispersed in different RS outer codes and different RS inner codes. This improves decoding performance.

In a possible design, FEC decoding is performed on each of the Y RS inner codes to obtain K2 payload symbols corresponding to each RS inner code; and the X RS outer codes are determined based on the K2 payload symbols corresponding to each RS inner code. In this way, the decoded Y RS inner codes are converted into the X RS outer codes.

In a possible design, a location of a symbol on which an error occurs in a target RS inner code is obtained, where the target RS inner code is any one of the Y RS inner codes; FEC decoding is performed, based on the location of the symbol on which an error occurs in the target RS inner code, on N2 symbols included in the target RS inner code, to obtain K2 payload symbols corresponding to the target RS inner code. Based on the location of the symbol on which an error occurs, a quantity of corrected symbols on which errors occur in the RS inner code can be increased. This further improves error correction performance.

In a possible design, for each symbol included in each of the X RS outer codes, based on a number h of an RS inner code to which the symbol belongs and a number c of the symbol in the RS inner code h, a number j of an RS outer code to which the symbol belongs and a number i of the symbol in the RS outer code j are determined according to the following second formulas, where h=0, 1, . . . , Y−1, and c=0, 1, . . . , K2−1, where the second formulas are: j=(h*K2+c)MOD X and i=floor ((h*K2+c)/X), where floor represents a rounding down operation, and MOD represents a modulo operation. In this way, the decoded Y RS inner codes are converted into the X RS outer codes.

Optionally, a location of a symbol on which an error occurs in a target RS outer code is obtained, where the target RS outer code is any one of the X RS outer codes; and FEC decoding is performed on the target RS outer code based on the location of the symbol on which an error occurs in the target RS outer code, to obtain K1 payload symbols corresponding to the target RS outer code. Based on the location of the symbol on which an error occurs, a quantity of corrected symbols on which errors occur in the RS outer code can be increased. This further improves error correction performance.

In a possible design, the symbol includes a plurality of segments. When it is detected that a signal amplitude of a segment in the symbol is not within a preset amplitude range or it is detected that a value of a segment in the symbol is not within a preset value set, it is determined that the symbol is a symbol on which an error occurs. The preset value set includes a plurality of preset values. Because the symbol on which an error occurs is obtained, the location of the symbol on which an error occurs may be introduced during decoding, to improve error correction performance.

In a possible design, symbols are received over L communication links, where L=1, 2, 3, . . . . Based on each received symbol and a sequence of receiving the symbols, symbols included in an RS inner code 0 to an RS inner code (Y−1) are determined, so that the Y RS inner codes are received.

According to a third aspect, an embodiment of this application provides an encoding apparatus, configured to perform the method according to any one of the first aspect or the possible implementations of the first aspect. Specifically, the apparatus includes units configured to perform the method according to any one of the first aspect or the possible implementations of the first aspect.

According to a fourth aspect, an embodiment of this application provides a decoding apparatus, configured to perform the method according to any one of the second aspect or the possible implementations of the second aspect. Specifically, the apparatus includes units configured to perform the method according to any one of the second aspect or the possible implementations of the second aspect.

According to a fifth aspect, an embodiment of this application provides another encoding apparatus. The apparatus includes at least one processor, at least one memory, and at least one transceiver. The at least one processor is connected to the at least one memory and the at least one transceiver through a bus. The at least one memory stores one or more programs, the one or more programs are configured to be executed by the at least one processor, and the one or more programs include an instruction used to perform the method according to any one of the first aspect or the possible implementations of the first aspect.

According to a sixth aspect, an embodiment of this application provides another decoding apparatus. The apparatus includes at least one processor, at least one memory, and at least one transceiver. The at least one processor is connected to the at least one memory and the at least one transceiver through a bus. The at least one memory stores one or more programs, the one or more programs are configured to be executed by the at least one processor, and the one or more programs include an instruction used to perform the method according to any one of the second aspect or the possible implementations of the second aspect.

According to a seventh aspect, this application provides a computer-readable storage medium. The computer-readable storage medium stores an instruction, and when the instruction is run on a computer, the computer is enabled to perform the methods in the foregoing aspects.

According to an eighth aspect, this application provides a computer program product including an instruction. When the computer program product runs on a computer, the computer is enabled to perform the methods in the foregoing aspects.

According to a ninth aspect, an embodiment of this application provides a chip. The chip includes a programmable logic circuit and/or a program instruction. When the chip runs, the chip is configured to implement the method according to any one of the first aspect, the second aspect, the possible implementations of the first aspect, or the possible implementations of the second aspect.

According to a tenth aspect, an embodiment of this application provides an encoding and decoding system. The system includes the apparatus according to the third aspect and the apparatus according to the fourth aspect, or includes the apparatus according to the fifth aspect and the apparatus according to the sixth aspect.

BRIEF DESCRIPTION OF DRAWINGS

FIG. 7 is a schematic diagram of payload symbols included in 17 RS inner codes according to an embodiment of this application;

FIG. 8 is a schematic diagram of payload symbols included in 34 RS inner codes according to an embodiment of this application;

FIG. 9 is a schematic diagram of payload symbols included in 68 RS inner codes according to an embodiment of this application;

FIG. 10 is a schematic diagram of 17 RS inner codes according to an embodiment of this application;

FIG. 11 is a schematic diagram of 34 RS inner codes according to an embodiment of this application;

FIG. 12 is a schematic diagram of 68 RS inner codes according to an embodiment of this application;

FIG. 13 is a flowchart of a decoding method according to an embodiment of this application;

DESCRIPTION OF EMBODIMENTS

The following further describes in detail the embodiments of this application with reference to the accompanying drawings.

Figure 1:
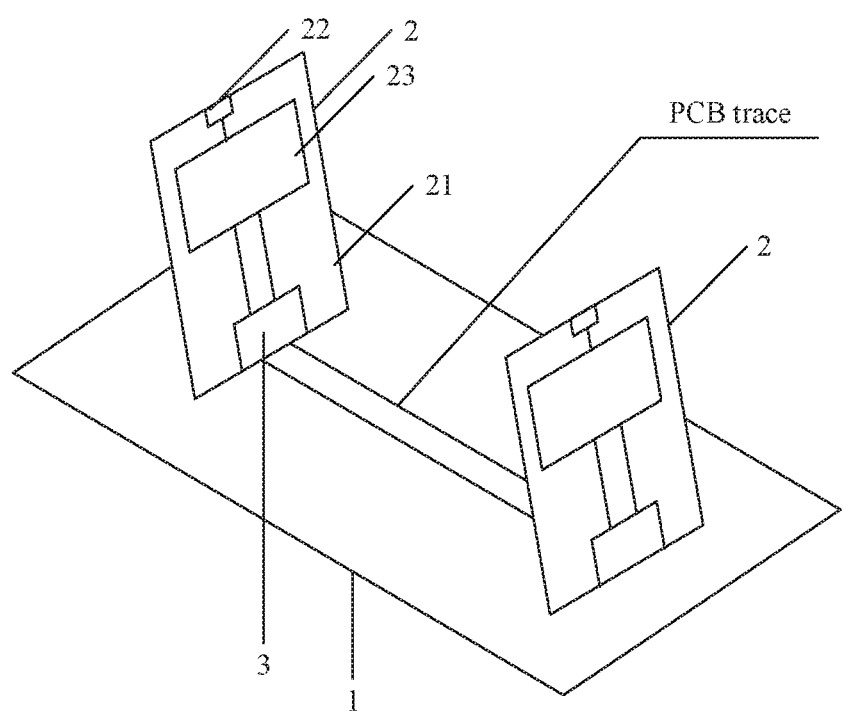
FIG. 1 is a schematic structural diagram of a switching device according to an embodiment of this application.

Referring to FIG. 1, an embodiment of this application provides a switching device. The switching device may be a router, a switch, or the like, and includes:

a backplane 1 and a plurality of line cards 2, where the plurality of line cards 2 are connected through the backplane 1.

The switching device is deployed in a communications network, and each of the plurality of line cards 2 is connected to the communications network. The line card 2 may receive a data bitstream sent by a device in the communications network; convert the data bitstream into at least one symbol, where each symbol has an equal length and includes a plurality of bits; and send the at least one symbol to another line card 2 through the backplane 1. The another line card 2 receives the at least one symbol, converts the at least one symbol into the data bitstream, and forwards the data bitstream to another device in the communications network.

Optionally, each line card 2 may be connected to the backplane 1 through a backplane connector 3.

The line card 2 may include a PCB 21, a communications port 22, and at least one chip 23. The at least one chip 23 is deployed on the PCB 21, and each chip 23 may be connected to the communications port 22 through a PCB trace on the PCB 21, and may be connected to the backplane connector 3 through the PCB trace on the PCB 21. Each backplane connector 3 is connected to a PCB trace on the backplane 1.

For ease of description, a line card 2 is referred to as a first line card. A chip 23 on the first line card receives, through a communications port 22, a data bitstream sent by a device in the communications network. If the chip 23 on the first line card needs to send the data bitstream to another line card 2 (for ease of description, the another line card 2 is referred to as a second line card), when the chip 23 on the first line card sends the data bitstream to the second line card, the chip 23 on the first line card converts the data bitstream into at least one symbol, performs forward error correction 0 encoding on the symbol obtained through conversion, and sends an encoded symbol on the PCB trace on the PCB 21 of the first line card. The encoded symbol passes through the PCB trace on the PCB 21 of the first line card, the backplane connector 3 connected to the first line card, the PCB trace on the backplane 1, a backplane connector connected to the second line card, and a PCB trace in the second line card. Then the encoded symbol is received by a chip 23 on the second line card from the PCB trace on the second line card. The chip 23 on the second line card performs FEC decoding on the received symbol, converts a decoded symbol into the data bitstream, and forwards the data bitstream to another device in the communications network through a communications port 22 of the second line card.

For example, the chip 23 on the first line card may include at least one outer-code encoder and at least one inner-code encoder, and FEC encoding is performed, by using the at least one outer-code encoder and the at least one inner-code encoder, on the symbol obtained through conversion. The chip 23 on the second line card may include at least one outer-code decoder and at least one inner-code decoder, and FEC decoding is performed on the received symbol by using the at least one outer-code decoder and the at least one inner-code decoder. For a detailed process of encoding performed by the chip 23 on the first line card and a detailed process of decoding performed by the chip 23 on the second line card, refer to descriptions in the following embodiments. Details are not described herein.

Figure 2:
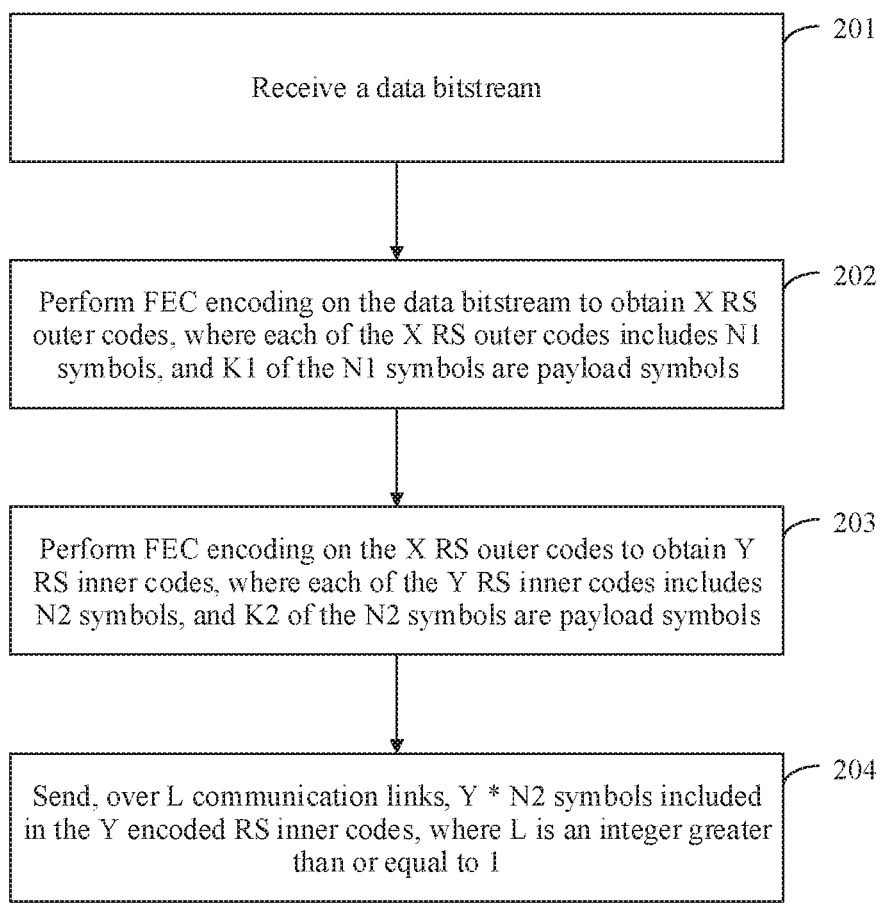
FIG. 2 is a flowchart of an encoding method according to an embodiment of this application.
Figure 3:
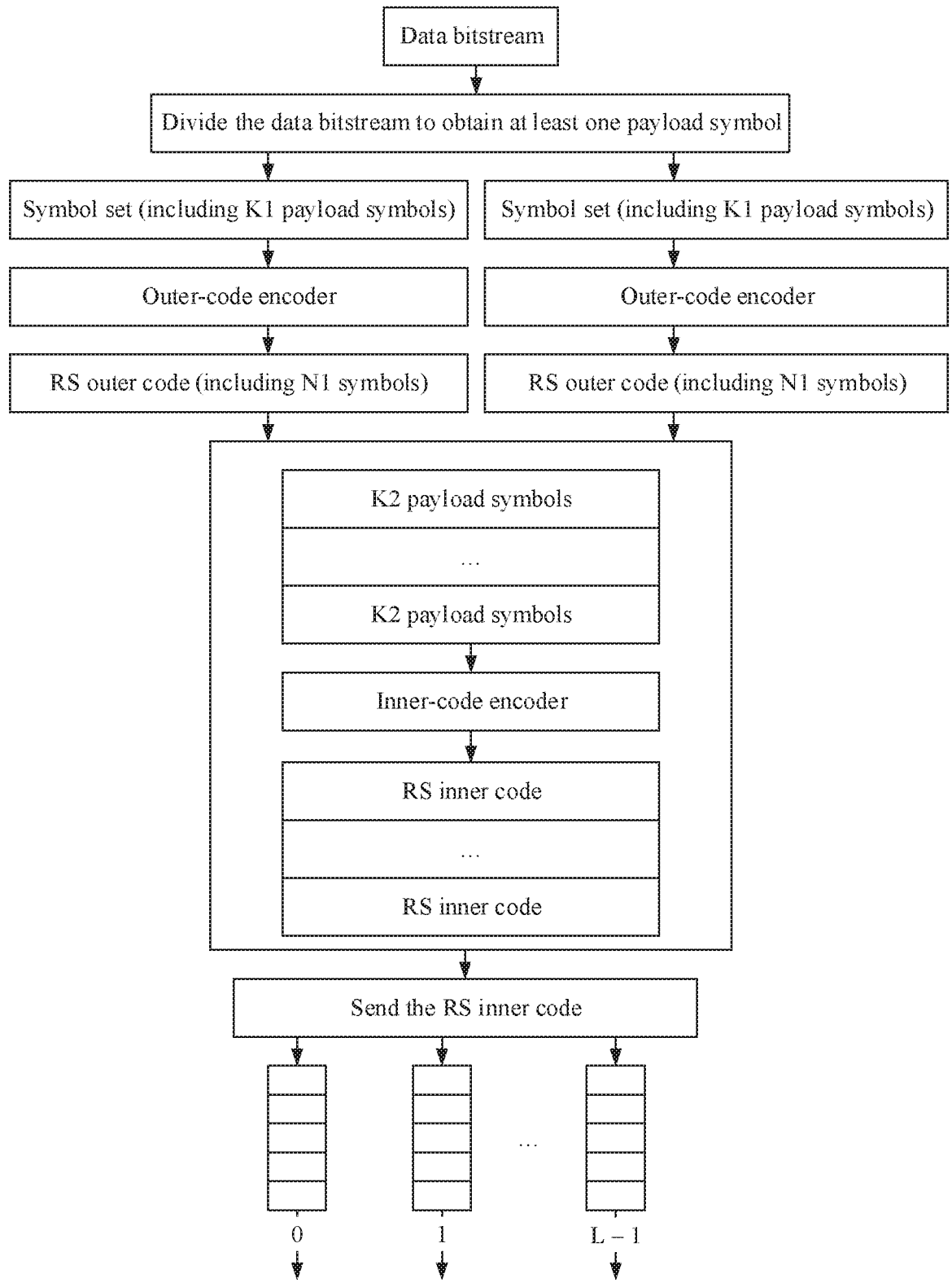
FIG. 3 is a flowchart of another encoding method according to an embodiment of this application.

Referring to FIG. 2 and FIG. 3, an embodiment of this application provides an encoding method. The method may be applied to a transmit end, for example, may be applied to the switching device shown in FIG. 1. The transmit end may be any line card or a chip on a line card in the switching device. The method includes the following steps.

Step 201: Receive a data bitstream.

The transmit end may receive the data bitstream from a communications network through a communications interface, and the data bitstream may include a plurality of bits.

Step 202: Perform FEC encoding on the data bitstream to obtain X RS outer codes, where each of the X RS outer codes includes N1 symbols, K1 of the N1 symbols are payload symbols, N1>K1, N1 and K1 are integers greater than 1, and X is an integer greater than 0.

N1 may be referred to as an outer-code length, K1 may be referred to as an outer-code information length, and each of the X RS outer codes may be represented as RS (N1, K1).

In this step, FEC encoding is performed on the data bitstream based on the outer-code length N1 and the outer-code information length K1 to obtain the X RS outer codes. Optionally, FEC encoding may be performed on the data bitstream by performing the following operations 2021 to 2023, to obtain the X RS outer codes. The operations are as follows.

2021: Divide the data bitstream to obtain at least one payload symbol, where each payload symbol includes m bits, and in is an integer greater than 1.

A value of m may be a numerical value such as 6, 8, or 10. The data bitstream includes a plurality of consecutive bits, and the data bitstream may be divided based on a sequence of all bits in the data bitstream, to obtain the at least one payload symbol. For example, a first bit to an $m^{th}$ bit in the data bitstream may be classified as a first payload symbol, an $(m+1)^{th}$ bit to a $(2m)^{th}$ bit may be classified as a second payload symbol, a $(2m+1)^{th}$ bit to a $(3)^{th}$ bit may be classified as a third payload symbol, and so on.

Because the transmit end may continuously receive data bitstreams from the communications network, payload symbols may be continuously obtained in this step.

2022: Each time when K1 payload symbols are obtained, the obtained K1 payload symbols constitute one symbol set.

For example, the obtained first payload symbol to the obtained $K1^{th}$ payload symbol constitute the $1^{st}$ symbol set, the obtained $(K1+1)^{th}$ payload symbol to the obtained $(2*K1)^{th}$ payload symbol constitute the $2^{nd}$ symbol set, the obtained $(2*K1+1)^{th}$ payload symbol to the obtained $(3*K1)^{th}$ payload symbol constitute the $3^{rd}$ symbol set, and so on. * represents a multiplication operation.

Optionally, each time when X symbol sets are constituted, FEC encoding may be performed on the X symbol sets by performing the following operation in 2023.

Optionally, when the transmit end receives the entire data bitstream at a moment, and a quantity of non-encoded symbol sets is less than X currently, a payload symbol may be obtained based on preset bits. All bits included in the obtained payload symbol are preset bits. Each time when K1 payload symbols are obtained, the obtained K1 payload symbols constitute one symbol set. This stops until X non-encoded symbol sets are obtained.

The preset bit may be 0 or 1.

2023: Each time when the X symbol sets are constituted, perform FEC encoding on the X symbol sets to obtain the X RS outer codes.

Optionally, the transmit end may include one or more outer-code encoders. Optionally, the transmit end is a line card or a chip on a line card, and the outer-code encoder may be an RS FEC outer-code encoder.

For each outer-code encoder, when performing FEC encoding one time, the outer-code encoder may perform FEC encoding on the K1 payload symbols to obtain one RS outer code, where the RS outer code includes N1 symbols. The first K1 symbols included in the RS outer code may be the K1 payload symbols, and the last (N1 K1) symbols included in the RS outer code may be redundant symbols. The (N1 K1) redundant symbols are generated when the outer-code encoder encodes the K1 payload symbols. The (N1−K1) redundant symbols are used to correct a symbol on which an error occurs, and the symbol on which an error occurs is a symbol on which an error occurs during transmission of the K1 payload symbols.

In this step, when the transmit end includes one outer-code encoder, FEC encoding may be performed on K1 payload symbols in one symbol set based on the outer-code length N1 and the outer-code information length K1, to obtain one RS outer code. The foregoing process is repeated until FEC encoding is performed on the last symbol set by using the outer-code encoder to obtain an RS outer code. In this way, the X RS outer codes are obtained.

For example, the transmit end may perform FEC encoding on the K1 payload symbols in the $1^{st}$ symbol set based on the outer-code length N1 and the outer-code information length K1 to obtain one RS outer code; perform FEC encoding on the K1 payload symbols in the $2^{nd}$ symbol set based on the outer-code length N1 and the outer-code information length K1 to obtain one RS outer code, . . . , and perform FEC encoding on K1 symbols in the $X^{th}$ symbol set based on the outer-code length N1 and the outer-code information length K1 to obtain one RS outer code. In this way; the X RS outer codes are obtained.

When the transmit end includes a plurality of outer-code encoders, FEC encoding may be performed on K1 payload symbols in each of a plurality of symbol sets by using a corresponding outer-code encoder in the plurality of outer-code encoders, to obtain a plurality of RS outer codes.

A quantity of outer-code encoders may be equal to X, or may be less than X. When the quantity of outer-code encoders is less than X, FEC encoding is performed for a plurality of times until the X RS outer codes are obtained.

Figure 4:
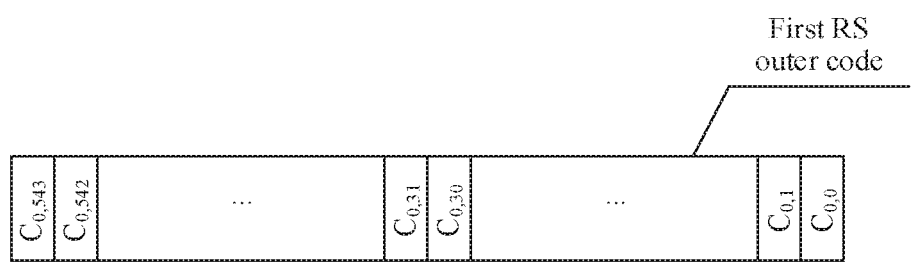
FIG. 4 is a schematic structural diagram of a first RS outer code according to an embodiment of this application.

For example, in this step, a value of X is 1, a value of N1 is 544, and a value of K1 is 514. In other words, there is one symbol set, and the symbol set includes 514 payload symbols. FEC encoding may be performed, by using one outer-code encoder, on the 514 payload symbols included in the symbol set, to obtain a first RS outer code. The first RS outer code includes 544 symbols, the first 514 symbols in the first RS outer code may be the 514 payload symbols; and the last 30 symbols in the first RS outer code are redundant symbols generated by the outer-code encoder. Referring to FIG. 4, the 544 symbols included in the first RS outer code may be respectively represented as $C_{0,0}$, $C_{0,1}$, . . . , and $C_{0,543}$.

Figure 5:
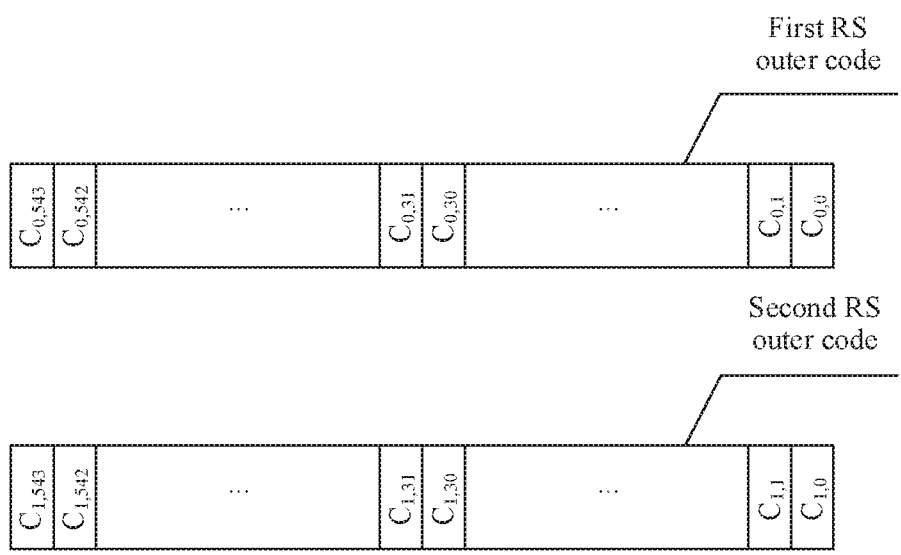
FIG. 5 is a schematic structural diagram of a first RS outer code and a second. RS outer code according to an embodiment of this application.

For another example, in this step, a value of X is 2, a value of N1 is 544, and a value of K1 is 514. In other words, there are two symbol sets, each symbol set includes 514 payload symbols, and the two symbol sets are a first symbol set and a second symbol set. It is assumed that the transmit end includes a first outer-code encoder and a second outer-code encoder. FEC encoding may be performed, by using the first outer-code encoder, on the 514 payload symbols included in the first symbol set, to obtain a first RS outer code, where the first 514 symbols in the first RS outer code may be the 514 payload symbols, and the last 30 symbols in the first RS outer code are redundant symbols generated by the first outer-code encoder. FEC encoding may be performed, by using the second outer-code encoder, on the 514 payload symbols included in the second symbol set, to obtain a second RS outer code, where the first 514 symbols in the second RS outer code may be the 514 payload symbols, and the last 30 symbols in the second RS outer code are redundant symbols generated by the second outer-code encoder. Referring to FIG. 5, the 544 symbols included in the first RS outer code may be respectively represented as $C_{0,0}, C_{0,1}, \ldots,$ and $C_{0,543}$; and the 544 symbols included in the second RS outer code may be respectively represented as $C_{1,0}, C_{1,1}, \ldots,$ and $C_{1,543}$.

Figure 6:
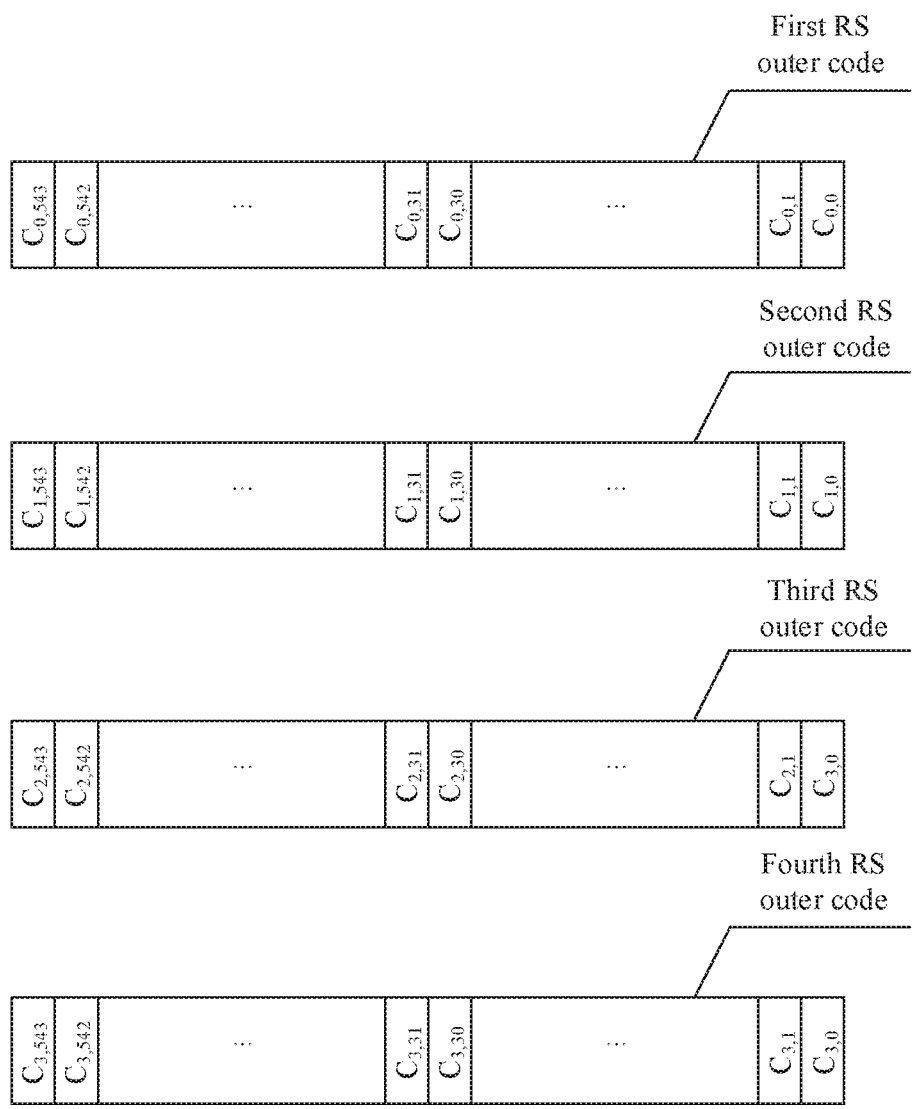
FIG. 6 is a schematic structural diagram of a first RS outer code, a second RS outer code, a third RS outer code, and a fourth RS outer code according to an embodiment of this application.

For another example, in this step, a value of X is 4, a value of N1 is 544, and a value of K1 is 514 In other words, there are four symbol sets, each symbol set includes 514 payload symbols, and the four symbol sets are a first symbol set, a second symbol set, a third symbol set, and a fourth symbol set. It is assumed that the transmit end includes a first outer-code encoder and a second outer-code encoder. FEC encoding may be performed, by using the first outer-code encoder, on the 514 payload symbols included in the first symbol set, to obtain a first RS outer code, where the first 514 symbols in the first RS outer code may be the 514 payload symbols, and the last 30 symbols in the first RS outer code are redundant symbols generated by the first outer-code encoder. FEC encoding may be performed, by using the second outer-code encoder, on the 514 payload symbols included in the second symbol set, to obtain a second RS outer code, where the first 514 symbols in the second RS outer code may be the 514 payload symbols, and the last 30 symbols in the second RS outer code are redundant symbols generated by the second outer-code encoder. FEC encoding is to be performed, by using the first outer-code encoder, on the 514 payload symbols included in the third symbol set, to obtain a third RS outer code, where the first 514 symbols in the third RS outer code may be the 514 payload symbols, and the last 30 symbols in the third RS outer code are redundant symbols generated by the first outer-code encoder. FEC encoding may be performed, by using the second outer-code encoder, on the 514 payload symbols included in the fourth symbol set, to obtain a fourth RS outer code, where the first 514 symbols in the fourth RS outer code may be the 514 payload symbols, and the last 30 symbols in the fourth RS outer code are redundant symbols generated by the second outer-code encoder. Referring to FIG. 6, the 544 symbols included in the first RS outer code may be respectively represented as $C_{0,0}, C_{0,1}, \ldots,$ and $C_{0,543}$, the 544 symbols included in the second RS outer code may be respectively represented as $C_{1,0}, C_{1,1}, \ldots,$ and $C_{1,543}$; the 544 symbols included in the third RS outer code may be respectively represented as $C_{2,0}, C_{2,1}, \ldots,$ and $C_{2,543}$; and the 544 symbols included in the fourth RS outer code may be respectively represented as $C_{0,3}, C_{3,1}, \ldots,$ and $C_{3,543}$.

Step 203: Perform FEC encoding on the X RS outer codes to obtain Y RS inner codes, where each of the Y RS inner codes includes N2 symbols, K2 of the N2 symbols are payload symbols, N2>K2, N2 and K2 are integers greater than 0, and Y is an integer greater than 1.

N2 may be referred to as an inner-code length, K2 may be referred to as an inner-code information length, and each of the Y RS inner codes may be represented as RS (N2, K2).

In a possible design, $Y=(X*N1)/K2$,

Optionally, N1=544, K1=514, N2=34, and K2=32; or N1=544, K1=514, N2=36, and K2=34.

In this step, FEC encoding is performed on the X RS outer codes based on the inner-code length N2 and the inner-code information length K2 to obtain the Y RS inner codes. Optionally, FEC encoding may be performed on the X RS outer codes by performing the following operations 2031 and 2032, to obtain the Y RS inner codes.

2031: For each of the Y RS inner codes, determine K2 payload symbols included in the RS inner code.

Optionally, when X is greater than or equal to 2, any two adjacent payload symbols in each RS inner code belong to different RS outer codes. When X is greater than or equal to 2, any two adjacent payload symbols that belong to a same RS outer code and that are in each RS inner code are separated by (X−1) symbols.

Optionally, for each of the K2 payload symbols included in each of the Y RS inner codes, based on a number j of an RS outer code to which the payload symbol belongs and a number i of the payload symbol in the RS outer code j, a number h of an RS inner code to which the payload symbol belongs and a number c of the payload symbol in the RS inner code h is determined according to the following first formulas, where j=0, 1, ..., X−1, and i=0, 1, ..., N1−1.

The first formulas are: $h=\text{floor}((i*X+j)/K2)$ and $c=(i*X+j)$ MOD K2, where floor represents a rounding down operation, for example, floor (2.6)=2, and floor (3.1)=3; MOD represents a modulo operation, for example, 5 MOD 2=1, and 15 MOD 4=3; and * represents a multiplication operation.

According to the first formulas, a number of an RS inner code to which each of X*N1 symbols included in the X RS outer codes belongs and a number of the symbol in the RS inner code may be obtained, so that the K2 payload symbols included in each of the Y RS inner codes are obtained.

Optionally, when X=1, N1 symbols included in one RS outer code are converted, according to the first formulas, into payload symbols included in the Y RS inner codes, where Y=N1/K2, K2 payload symbols included in an RS inner code 0 are a symbol 0 to a symbol (K2−1) of the RS outer code, K2 payload symbols included in an RS inner code 1 are a symbol K2 to a symbol (2*K2−1) of the RS outer code, and K2 payload symbols included in an RS inner code (Y−1) are a symbol (Y−1)*K2 to a symbol (Y*K2−1) of the RS outer code.

When X is greater than or equal to 2, X*N1 symbols included in the X RS outer codes are converted, according to the first formulas, into payload symbols included in the Y RS inner codes, where Y=(X*N1)/K2. In this case, any two adjacent payload symbols in each RS inner code belong to different RS outer codes. When X is greater than or equal to 2, any two adjacent payload symbols that belong to a same RS outer code and that are in each RS inner code are separated by (X−1) symbols.

For example, for the first RS outer code shown in FIG. 4, a number of the first RS outer code is 0. Numbers of the symbols $C_{0,0}, C_{0,1}, \ldots,$ and $C_{0,543}$ included in the first RS outer code are respectively 0, 1, ..., and 543. It is assumed that the inner-code length is 34 and the inner-code information length is 32. For the symbol $C_{0,0}$ numbered 0 in the first RS outer code, based on the number 0 of the first RS outer code to which the symbol $C_{0,0}$ belongs and the number 0 of the symbol $C_{0,0}$ in the first RS outer code, it is calculated, according to the foregoing first formulas, that a number of an RS inner code to which the symbol $C_{0,0}$ belongs is 0 and a number of the symbol $C_{0,0}$ in the RS inner code 0 is also 0. For the symbol $C_{0,1}$ numbered 1 in the first RS outer code, based on the number 0 of the first RS outer code to which the symbol $C_{0,1}$ belongs and the number 1 of the symbol $C_{0,1}$ in the first RS outer code, it is calculated, according to the foregoing first formulas, that a number of an RS inner code to which the symbol $C_{0,1}$ belongs is 0 and a number of the symbol $C_{0,1}$ in the RS inner code 0 is 1. For the symbol $C_{0,2}$ numbered 2 in the first RS outer code, based on the number 0 of the first RS outer code to which the symbol $C_{0,2}$ belongs and the number 2 of the symbol $C_{0,2}$ in the first RS outer code, it is calculated, according to the foregoing first formulas, that a number of an RS inner code to which the symbol $C_{0,2}$ belongs is 0 and a number of the symbol $C_{0,2}$ in the RS inner code 0 is 2. The foregoing process is repeated until the symbol $C_{0,543}$ numbered 543 in the first RS outer code is calculated. Based on the number 0 of the first RS outer code to which the symbol $C_{0,543}$ belongs and the number 543 of the symbol $C_{0,543}$ in the first RS outer code, it is calculated, according to the foregoing first formulas, that a number of an RS inner code to which the symbol $C_{0,543}$ belongs is 16 and a number of the symbol $C_{0,543}$ in the RS inner code 16 is 31. Refer to payload symbols included in 17 RS inner codes shown in FIG. 7. Each row shown in FIG. 7 represents payload symbols in one RS inner code, and each row includes 32 payload symbols. It should be noted that in a specific implementation process, a matrix shown in FIG. 7 may exist, or a matrix shown in FIG. 7 may not exist. When the matrix shown in FIG. 7 does not exist, each time when one payload symbol belonging to the RS inner code is determined, the following operation of performing FEC encoding on the payload symbol in 2032 is performed. When the last payload symbol in the RS inner code is determined, FEC encoding is performed on the last payload symbol, so that FEC encoding is performed on K2 payload symbols in the RS inner code. A meaning of a matrix structure in the following examples are the same as a meaning of the matrix structure shown in FIG. 7. Details are not described again.

For another example, for the first RS outer code and the second RS outer code shown in FIG. 5, a number of the first RS outer code is 0, and a number of the second RS outer code is 1. Numbers of the symbols $C_{0,0}, C_{0,1}, \ldots$, and $C_{0,543}$ included in the first RS outer code are respectively 0, 1, ..., and 543; and numbers of the symbols $C_{1,0}, C_{1,1}, \ldots$, and $C_{1,543}$ included in the second RS outer code are respectively 0, 1, ..., and 543. It is assumed that the inner-code length is 34 and the inner-code information length is 32. For the symbol $C_{0,0}$ numbered 0 in the first RS outer code, based on the number 0 of the first RS outer code to which the symbol $C_{0,0}$ belongs and the number 0 of the symbol $C_{0,0}$ in the first RS outer code, it is calculated; according to the foregoing first formulas, that a number of an RS inner code to which the symbol $C_{0,0}$ belongs is 0 and a number of the symbol $C_{0,0}$ in the RS inner code 0 is also 0. For the symbol $C_{0,1}$ numbered 1 in the first RS outer code, based on the number 0 of the first RS outer code to which the symbol $C_{0,1}$ belongs and the number 1 of the symbol $C_{0,1}$ in the first RS outer code, it is calculated, according to the foregoing first formulas, that a number of an RS inner code to which the symbol $C_{0,1}$ belongs is 0 and a number of the symbol $C_{0,1}$ in the RS inner code 0 is 2. For the symbol $C_{0,2}$ numbered 2 in the first RS outer code, based on the number 0 of the first RS outer code to which the symbol $C_{0,2}$ belongs and the number 2 of the symbol $C_{0,2}$ in the first RS outer code, it is calculated, according to the foregoing first formulas, that a number of an RS inner code to which the symbol $C_{0,2}$ belongs is 0 and a number of the symbol $C_{0,2}$ in the RS inner code 0 is 4. The foregoing process is repeated until the symbol $C_{1,543}$ numbered 543 in the second RS outer code is calculated. Based on the number 1 of the second RS outer code to which the symbol $C_{1,543}$ belongs and the number 543 of the symbol $C_{1,543}$ in the second RS outer code; it is calculated, according to the foregoing first formulas, that a number of an RS inner code to which the symbol $C_{1,543}$ belongs is 33 and a number of the symbol $C_{1,543}$ in the RS inner code 33 is 31. In this way, payload symbols included in 34 RS inner codes shown in FIG. 8 are obtained. Each row shown in FIG. 8 represents payload symbols in one RS inner code, and each row includes 32 payload symbols.

In the example shown in FIG. 8, X=2, any two adjacent payload symbols in each RS inner code belong to different RS outer codes, and any two adjacent payload symbols that belong to a same RS outer code and that are in each RS inner code are separated by (X−1) symbols, that is, separated by one symbol. For example, payload symbols $C_{0,0}$ and $C_{1,0}$ in FIG. 8 are two adjacent payload symbols in an RS inner code 0, the payload symbol $C_{0,0}$ belongs to a first RS outer code, and the payload symbol $C_{1,0}$ belongs to a second RS outer code. In the RS inner code 0, the payload symbol $C_{0,0}$ and a payload symbol $C_{0,1}$ are adjacent payload symbols that belong to the first RS outer code, and the payload symbol $C_{0,0}$ and the payload symbol $C_{0,1}$ are separated by one symbol.

For another example, for the first RS outer code, the second RS outer code, the third RS outer code; and the fourth RS outer code shown in FIG. 6, a number of the first RS outer code is 0, a number of the second RS outer code is 1, a number of the third. RS outer code is 2, and a number of the fourth RS outer code is 3. Numbers of the symbols $C_{0,0}, C_{0,1}, \ldots$, and $C_{0,543}$ included in the first RS outer code are respectively 0, 1, and 543; numbers of the symbols $C_{1,0}, C_{1,1},$ and $C_{1,543}$ included in the second RS outer code are respectively 0, 1, ..., and 543; numbers of the symbols $C_{2,0}, C_{2,1}, \ldots$, and $C_{2,543}$ included in the third RS outer code are respectively 0, 1, ..., and 543; and numbers of the symbols $C_{3,0}, C_{3,1}, \ldots$, and $C_{3,543}$ included in the fourth RS outer code are respectively 0, 1, and 543. It is assumed that the inner-code length is 34 and the inner-code information length is 32. For the symbol $C_{0,0}$ numbered 0 in the first RS outer code; based on the number 0 of the first RS outer code to which the symbol $C_{0,0}$ belongs and the number 0 of the symbol $C_{0,0}$ in the first RS outer code, it is calculated, according to the foregoing first formulas, that a number of an RS inner code to which the symbol $C_{0,0}$ belongs is 0 and a number of the symbol $C_{0,0}$ in the RS inner code 0 is also 0. For the symbol $C_{0,1}$ numbered 1 in the first RS outer code, based on the number 0 of the first RS outer code to which the symbol $C_{0,2}$ belongs and a number 2 of the symbol $C_{0,2}$ in the first RS outer code, it is calculated, according to the foregoing first formulas, that a number of an RS inner code to which the symbol $C_{0,2}$ belongs is 0 and a number of the symbol $C_{0,2}$ in the RS inner code 0 is 4. For the symbol $C_{0,2}$ numbered 2 in the first RS outer code, based on the number 0 of the first RS outer code to which the symbol $C_{0,2}$ belongs and the number 2 of the symbol $C_{0,2}$ in the first RS outer code, it is calculated, according to the foregoing first formulas, that a number of an RS inner code to which the symbol $C_{0,2}$ belongs is 0 and a number of the symbol $C_{0,2}$ in the RS inner code 0 is 8. The foregoing process is repeated until the symbol $C_{3,543}$ numbered 543 in the fourth RS outer code is calculated. Based on the number 3 of the fourth RS outer code to which the symbol $C_{3,543}$ belongs and the number 543 of the symbol $C_{3,543}$ in the fourth RS outer code, it is calculated, according to the foregoing first formulas, that a number of an RS inner code to which the symbol $C_{3,543}$ belongs is 67 and a number of the symbol $C_{3,543}$ in the RS inner code 67 is 31. In this way, payload symbols included in 68 RS inner codes shown in FIG. 9 are obtained. Each row shown in FIG. 9 represents payload symbols in one RS inner code, and each row includes 32 payload symbols.

2032: For each RS inner code, perform FEC encoding on the K2 payload symbols included in the RS inner code, to obtain the RS inner code including N2 symbols.

Optionally, the transmit end may include one or more inner-code encoders. Optionally, the inner-code encoder may be an RS FEC inner-code encoder.

For each inner-code encoder, when performing FEC encoding one time, the inner-code encoder may perform FEC encoding on the K2 payload symbols to obtain one RS inner code, where the RS inner code includes N2 symbols. The first K2 symbols included in the RS inner code may be the K2 payload symbols, and the last (N2−K2) symbols included in the RS inner code may be redundant symbols. The (N2−K2) redundant symbols are generated when the inner-code encoder encodes the K2 payload symbols. The (N2−K2) redundant symbols are used to correct a symbol on which an error occurs, and the symbol on which an error occurs is a symbol on which an error occurs during transmission of the K2 payload symbols.

In this step, when the transmit end includes one inner-code encoder, FEC encoding is performed, by using the inner-code encoder, on the K2 payload symbols included in each RS inner code, to obtain each RS inner code.

For example, a value of the inner-code length N2 is 34, and a value of the inner-code information length K2 is 32. For the 32 payload symbols included in each of the 17 RS inner codes shown in FIG. 7, FEC encoding may be performed, by using one inner-code encoder, on 32 payload symbols in an RS inner code 0 to obtain the RS inner code 0, where the first 32 symbols included in the RS inner code 0 may be the 32 payload symbols, and the last two symbols included in the RS inner code 0 are redundant symbols generated in the encoding process, where the last two symbols are $P_{0,0}$ and $P_{1,1}$, FEC encoding continues to be performed, by using the one inner-code encoder, on 32 payload symbols included in an RS inner code 1 to obtain the RS inner code 1, . . . , and FEC encoding is performed, by using the one inner-code encoder, on 32 payload symbols included in an RS inner code 16 to obtain the RS inner code 16. In this way, 17 RS inner codes shown in FIG. 10 are obtained. Each row shown in FIG. 10 represents one RS inner code, and each row includes 34 symbols.

When the transmit end includes a plurality of inner-code encoders, payload symbols included in each of the plurality of RS inner codes are input into a corresponding inner-code encoder of the plurality of inner-code encoders, and FEC encoding is performed, by using each of the plurality of inner-code encoders, on K2 payload symbols included in the RS inner code, to obtain one RS inner code.

A quantity of inner-code encoders in the transmit end may be equal to Y or may be less than Y When the quantity of internal-code encoders is less than Y, the foregoing process may be repeated until the Y RS inner codes are obtained.

For example, a value of the inner-code length N2 is 34, a value of the inner-code information length K2 is 32, and it is assumed that the transmit end includes 17 inner-code encoders. For payload symbols included in the 17 RS inner codes shown in FIG. 7, FEC encoding is performed, by using the 17 inner-code encoders, on the 32 payload symbols included in each of the 17 RS inner codes, to obtain the 17 RS inner codes. The 17 RS inner codes are shown in FIG. 10. Each row shown in FIG. 10 represents one RS inner code, and each row includes 34 symbols.

For another example, for the payload symbols included in the 34 RS inner codes shown in FIG. 8, when payload symbols included in an RS inner code 0 to an RS inner code 16 are obtained, FEC encoding is performed, by using the 17 inner-code encoders, on the payload symbols included in the RS inner code 0 to the RS inner code 16, to obtain the RS inner code 0 to the RS inner code 16; and when payload symbols included in an RS inner code 17 to an RS inner code 33 are obtained, FEC encoding continues to be performed, by using the 17 inner-code encoders, on the payload symbols included in the RS inner code 17 to the RS inner code 33, to obtain the RS inner code 17 to the RS inner code 33. In this way, the 34 RS inner codes are obtained. The 34 RS inner codes are shown in FIG. 11. Each row shown in FIG. 11 represents one RS inner code, and each row includes 34 symbols.

For another example, for the payload symbols included in the 68 RS inner codes shown in FIG. 9, when payload symbols included in an RS inner code 0 to an RS inner code 16 are obtained, FEC encoding is performed, by using the 17 inner-code encoders, on the payload symbols included in the RS inner code 0 to the RS inner code 16, to obtain the RS inner code 0 to the RS inner code 16; when payload symbols included in an RS inner code 17 to an RS inner code 33 are obtained, FEC encoding continues to be performed, by using the 17 inner-code encoders, on the payload symbols included in the RS inner code 17 to the RS inner code 33, to obtain the RS inner code 17 to the RS inner code 33; when payload symbols included in an RS inner code 34 to an RS inner code 50 are obtained, FEC encoding continues to be performed, by using the 17 inner-code encoders, on the payload symbols included in the RS inner code 34 to the RS inner code 50, to obtain the RS inner code 34 to the RS inner code 50; and when payload symbols included in an RS inner code 51 to an RS inner code 67 are obtained, FEC encoding continues to be performed; by using the 17 inner-code encoders, on the payload symbols included in the RS inner code 51 to the RS inner code 67, to obtain the RS inner code 51 to the RS inner code 67. In this way, the 68 RS inner codes are obtained. The 68 RS inner codes are shown in FIG. 12. Each row shown in FIG. 12 represents one RS inner code, and each row includes 34 symbols.

Step 204: Send, over L communication links, Y*N2 symbols included in the Y encoded. RS inner codes, where L is an integer greater than or equal to 1.

The L communication links are communication links between the transmit end and a receive end. The communication link may be a physical link between the transmit end and the receive end, and the physical link may be a PCB trace or the like.

When X is an integer greater than 1, for symbols sent over a same communication link, any two adjacent symbols belong to different RS inner codes, and any two adjacent symbols that belong to a same RS inner code are separated by (D−1) symbols, where D is an integer greater than 1, and D<Y. D may be referred to as an interleaving depth.

When X is an integer greater than 1, for symbols sent over a same communication link, any two adjacent symbols belong to different RS inner codes.

During symbol transmission over a communication link, when an error occurs on a symbol, errors usually occur on a plurality of consecutive symbols. Because two adjacent symbols transmitted over the communication link belong to different RS outer codes and different RS inner codes, symbols on which errors occur may be dispersed in different RS outer codes and different RS inner codes, thereby reducing a quantity of symbols on which errors occur in a same RS outer code and in a same RS inner code. This can improve error correction performance during decoding at the receive end.

Optionally, when X=1, in this step, the Y*N2 symbols may be sent in the following manner. At least one sub-block is formed, where each sub-block includes D consecutive RS inner codes. For example, a sub-block 0 includes an RS inner code 0 to an RS inner code (D−1), and a sub-block 1 includes an RS inner code D to an RS inner code (2*D−1). L sets are selected from a sub-block n, each set includes D symbols with a same number, and the L sets are respectively sent over the L communication links, where n=0, 1, 2, 3, . . . .

Optionally, Y may be an integer multiple of D, or Y may not be an integer multiple of D.

When Y is an integer multiple of D, the generated Y RS inner codes may be directly used to constitute S sub-blocks; where S=Y/D. When Y is not an integer multiple of D, S sub-blocks may be first constituted from the Y RS inner codes, where S is a maximum quantity of sub-blocks that can be constituted from the Y RS inner codes. To be specific, the first D*S RS inner codes constitute a sub-block 0 to a sub-block (S−1). For the remaining Q RS inner codes, the Q RS inner codes are an RS inner code D*S to an RS inner code (Y−1). Y RS inner codes are re-obtained by performing the operations in the foregoing steps 202 and 203, and the Q RS inner codes and the first (D−Q) RS inner codes of the re-obtained Y RS inner codes constitute a sub-block S.

For example, assuming that D=9, for the 17 RS inner codes shown in FIG. 10, the first 9 RS inner codes shown in FIG. 10 constitute a sub-block 0, and for the remaining 8 RS inner codes shown in FIG. 10, after 17 RS inner codes are re-obtained; the remaining 8 RS inner codes and an RS inner code 0 of the re-obtained 17 RS inner codes constitute a sub-block 1. Sub-blocks are continuously constituted by performing the foregoing operations.

Optionally, when L=1, one set is obtained from the sub-block 0, the set includes D symbols whose numbers are all 0, and the set is sent over the communication link; one set is obtained from the sub-block 0, the set includes D symbols whose numbers are all 1, and the D symbols included in the set are sent over the communication link; and one set is obtained from the sub-block 0, the set includes D symbols whose numbers are all N2, and the D symbols included in the set are sent over the communication link set. A sub-block 1, a sub-block 2, a sub-block 3, and so on are sent in the foregoing manner.

When L is greater than 1, L sets may be obtained from the sub-block 0; a set 0 includes D symbols whose numbers are all 0, a set 1 includes D symbols whose numbers are all 1, and a set (L−1) includes D symbols whose numbers are all L−1; one communication link corresponding to each of the L sets is determined; and the D symbols included in each set are sent over the communication link corresponding to the set. For example, the set 0; the set 1, . . . ; and the set (L−1) respectively correspond to a communication link 0, a communication link 1, . . . , and a communication link (L−1); and the D symbols included in the set 0, the D symbols included in the set 1, . . . , and the D symbols included in the set (L−1) are respectively sent over the communication link 0, the communication link 1, and the communication link (L−1).

Then, L sets are obtained again from the sub-block 0, where a set 0 includes D symbols whose numbers are all L, a set 1 includes D symbols whose numbers are all L+1, . . . , and a set (L−1) includes D symbols whose numbers are 2 L−1; one communication link corresponding to each of the L sets is determined; and the D symbols included in each set are sent over the communication link corresponding to the set. For example, the set 0, the set 1, . . . , and the set (L−1) respectively correspond to the communication link 0, the communication link 1, . . . , and the communication link (L−1); and the D symbols included in the set 0, the D symbols included in the set 1, . . . , and the D symbols included in the set (L−1) are respectively sent over the communication link 0, the communication link 1, . . . , and the communication link (L−1). The foregoing process is repeated until the entire sub-block 0 is sent. After the sub-block 0 is sent, a sub-block 1, a sub-block 2, a sub-block 3, and so on are sent according to the foregoing process.

Optionally, when X is greater than 1, in this step, the Y*N2 symbols included in the Y RS inner codes may be sent by performing the following steps 2041 to 2045.

2041: Constitute at least one sub-block, where each sub-block includes D RS inner codes.

Optionally, Y may be an integer multiple of D, or Y may not be an integer multiple of D.

Optionally, D is greater than X, a value of D may be equal to a*X+1, and a is an integer greater than 0.

For example, assuming that D=9, for the 34 RS inner codes shown in FIG. 11, an RS inner code 0 to an RS inner code 8 shown in FIG. 11 constitute a sub-block 0, an RS inner code 9 to an RS inner code 17 shown in FIG. 11 constitute a sub-block 1, and an RS inner code 18 to an RS inner code 26 shown in FIG. 11 constitute a sub-block 2. For the remaining 7 RS inner codes shown in FIG. 11, after Y RS inner codes shown in FIG. 11 are re-obtained, the remaining 7 RS inner codes and an RS inner code 0 and an RS inner code 1 of the re-obtained Y RS inner codes constitute a sub-block 3. Sub-blocks are continuously formed by performing the foregoing operations.

Optionally, when L=1, one set is obtained from the sub-block 0, the set includes D symbols whose numbers are all 0, and the D symbols included in the set is sent over the communication link; one set is obtained from the sub-block 0, the set includes D symbols whose numbers are all 1, and the D symbols included in the set are sent over the communication link; . . . ; and one set is obtained from the sub-block 0, the set includes D symbols whose numbers are all N2−1, and the D symbols included in the set are sent over the communication link set. In this way, the entire sub-block 0 is sent. A sub-block 1, a sub-block 2, a sub-block 3, and so on continue to be sent in the foregoing manner.

For example, assuming that D=9, an RS inner code 0 to an RS inner code 8 in FIG. 11 constitute a sub-block 0, one set is obtained from the sub-block 0, the set includes nine symbols with a same number, and the nine symbols are $C_{0,0}$, $C_{1,16}$, $C_{0,32}$, $C_{1,48}$, $C_{0,64}$, $C_{1,80}$, $C_{0,96}$, $C_{1,172}$, and $C_{0,128}$. The symbols $C_{0,0}$, $C_{1,16}$, $C_{0,32}$, $C_{1,48}$, $C_{0,64}$, $C_{1,80}$, $C_{0,96}$, $C_{1,112}$, and $C_{0,128}$ are sequentially sent over the communication link. Then, one set is obtained again from the sub-block 0, the set includes nine symbols with a same number, and the nine symbols are $C_{1,0}$, $C_{0,16}$, $C_{1,32}$, $C_{0,48}$, $C_{1,64}$, $C_{0,80}$, $C_{1,96}$, $C_{0,112}$, and $C_{1,128}$. The symbols $C_{1,0}$, $C_{0,16}$, $C_{1,32}$, $C_{0,48}$, $C_{1,64}$, $C_{0,80}$, $C_{1,96}$, $C_{0,112}$, and $C_{1,128}$ are sequentially sent over the communication link. Sending continues to be performed in the foregoing manner until the entire sub-block 0 is sent.

In this example, in the symbols sent over the communication link, any two adjacent symbols belong to different RS inner codes, and any two adjacent symbols that belong to a same RS inner code are separated by (D−1) symbols, that is, separated by eight symbols. For example, the symbols $C_{0,0}$ and 01,16 that are sent over the communication link are two adjacent symbols, but the symbols $C_{0,0}$ and 01,16 respectively belong to an RS inner code 0 and an RS inner code 1. The symbols $C_{0,0}$ and $C_{1,0}$ that are sent over the communication link belong to the RS inner code 0, and the symbols $C_{0,0}$ and $C_{1,0}$ are separated by eight symbols.

When L is greater than 1, the symbols may be sent by performing the following steps 2042 to 2045.

2042: Obtain L sets from the sub-block 0, where each set includes D symbols with a same number, and send the symbols included in the L sets over the L communication links.

The L sets may be obtained from the sub-block 0, where a set 0 includes D symbols whose numbers are all 0, a set 1 includes D symbols whose numbers are all 1, . . . , and a set (L−1) includes D symbols whose numbers are all L−1; one communication link corresponding to each of the L sets is determined; and the D symbols included in each set are sent over the communication link corresponding to the set.

Optionally, in this step, each sub-block may be a matrix including D RS inner codes, the matrix includes D rows*N2 columns of symbols, and each column includes D symbols with a same number. It is assumed that the sub-block 0 includes N2 columns of symbols, the N2 columns of symbols are respectively symbols $B_0$, symbols $B_1$, symbols $B_2$, . . . , and symbols $B_{N2}$, and each column of symbols constitutes one set. L sets are obtained from the sub-block 0, the L sets are respectively a set 0, a set 1, . . . , and a set L−1). The set 0, the set 1, . . . , and the set (L−1) are respectively the symbols $B_0$ in column 0, the symbols $B_1$ in column 1, . . . , and symbols $B_{L-1}$ in column (L−1). The set 0, the set 1, . . . , and the set (L−1) respectively correspond to a communication link 0, a communication link 1, . . . , and a communication link (L−1); and the symbols $B_0$ in the set 0, the symbols $B_1$ in the set 1, . . . , and the symbols $B_{L-1}$ in the set (L−1) are respectively sent over the communication link 0, the communication link 1, . . . , and the communication link (L−1).

Assuming that L is equal to 4, symbols $B_0$ in a set 0, symbols $B_1$ in a set 1, symbols $B_2$ in a set 2, symbols $B_3$ in a set 3 are obtained from the sub-block 0, it is determined that the symbols $B_0$ in the set 0, the symbols $B_1$ in the set 1, the symbols $B_2$ in the set 2, and the symbols $B_3$ in the set 3 respectively correspond to a communication link 0, a communication link 1, a communication link 2, and a communication link 3; and the symbols $B_0$ in the set 0, the symbols $B_1$ in the set 1, the symbols $B_2$ in the set 2, and the symbols $B_3$ in the set 3 are respectively sent over the communication link 0, the communication link 1, the communication link 2, and the communication link 3.

2043: Obtain L sets from the remaining symbols of the sub-block n, where each of the L sets includes D symbols with a same number, and n=0, 1, 2, . . . .

The L sets are obtained from the remaining symbols of the sub-block 0. The L sets are respectively a set 0, a set 1, . . . , and a set (L−1). The set 0 includes D symbols whose numbers are all L, the set 1 includes D symbols whose numbers are L+1, . . . , and the set (L−1) includes D symbols whose numbers are 2*L−1. For example, when L is equal to 4, four sets are obtained from the remaining symbols of the sub-block 0; the four sets are respectively a set 0, a set 1, a set 2, and a set 3; and the set 0, the set 1, the set 2, and the set 3 respectively include symbols $B_4$ in column 4, symbols $B_1$ in column 5, symbols $B_6$ in column 6, and symbols $B_7$ in column 7.

2044: Determine a communication link corresponding to each of the L sets, where the first symbol in the set of the L sets and the last symbol in a set that is sent last time over the communication link and that correspond to the set of the L sets belong to different RS outer codes.

Optionally, when L is greater than 1 and X is greater than 1, the transmit end and the receive end may pre-agree on a sending policy. There are a plurality of sending policies. One sending policy is described in this step, and other sending policies are not enumerated one by one.

In the sending policy, a number z of the set that is sent last time over the communication link (L−1) may be recorded. In this way, in this step, for each currently-to-be-sent set, a set z to a set (L−1) may respectively correspond to a communication link 0 to a communication link (L−z−1); and a set 0 to a set (z−1) may respectively correspond to a communication link (L−z) to a communication link (L−1).

For example, four sets that are sent last time are symbols $B_0$ in a set 0, symbols $B_1$ in a set 1, symbols $B_2$ in a set 2, and symbols $B_3$ in a set 3. In other words, the symbols $B_3$ in the set 3 are sent last time over the communication link 3. Therefore, z=3.

In this step, a currently-to-be-sent set 0, a currently-to-be-sent set 1, a currently-to-be-sent set 2, and a currently-to-be-sent set 3 respectively include obtained symbols $B_4$, symbols $B_5$, symbols $B_6$, and symbols $B_7$, so that the set 3 may correspond to the communication link 0, and the set 0 to the set 2 respectively correspond to the communication link 1 to the communication link 3.

2045: Send, over the communication link corresponding to each set, the D symbols included in the set.

Optionally, when a set is sent over a communication link, because each set includes D symbols, and each symbol includes m bits, when the symbols in the set are sent over the communication link corresponding to the set, the symbols are sent over the communication link at a bit granularity starting from the first symbol included in the set.

For example, the symbols $B_7$ in the to-be-sent set 3, the symbols $B_4$ in the to-be-sent set 0, the symbols $B_5$ in the to-be-sent set 1, and the symbols $B_3$ in the to-be-sent set 2 are respectively sent over the communication link 0, the communication link 1, the communication link 2, and the communication link 3. z=2 is recorded.

For another example, a set 0, a set 1, a set 2, and a set 3 that are obtained from the remaining columns of the sub-block 0 respectively include symbols $B_8$ in column 8, symbols $B_9$ in column 9, symbols $B_{10}$ in column 10, and symbols Bit in column 11. In other words, the currently-to-be-sent set 0, the currently-to-be-sent set 1, the currently-to-be-sent set 2, and the currently-to-be-sent set 3 respectively include the symbols $B_8$ in column 8, the symbols $B_9$ in column 9, the symbols $B_{10}$ in column 10, and the symbols Bit in column 11. The set 2 and the set 3 respectively correspond to the communication link 0 and the communication link 1, and the set 0 and the set 1 respectively correspond to the communication link 2 and the communication link 3. The symbols $B_{10}$ in the to-be-sent set 2, the symbols Bit in the to-be-sent set 3, the symbols $B_8$ in the to-be-sent set 0, and the symbols $B_9$ in the to-be-sent set 1 are respectively sent over the communication link 0, the communication link 1, the communication link 2, and the communication link 3. z=1 is recorded.

For another example, a set 0, a set 1, a set 2, and a set 3 that are obtained from the remaining columns of the sub-block 0 respectively include symbols $B_{12}$ in column 12, symbols $B_{13}$ in column 13, symbols $B_{14}$ in column 14, and symbols $B_{15}$ in column 15. In other words, the currently-to-be-sent set 0, the currently-to-be-sent set 1, the currently-to-be-sent set 2, and the currently-to-be-sent set 3 respectively include the symbols $B_{12}$ in column 12, the symbols 913 in column 13, the symbols $B_{14}$ in column 14, and the symbols 1315 in column 15. The set 1 to the set 3 respectively correspond to the communication link 0 to the communication link 2, and the set 0 corresponds to the communication link 3. The symbols $B_{13}$ in the to-be-sent set 1, the symbols $B_{14}$ in the to-be-sent set 2, the symbols Bis in the to-be-sent set 3, and the symbols 1312 in the to-be-sent set 0 are respectively sent over the communication link 0, the communication link 1, the communication link 2, and the communication link 3. z=0 is recorded.

For another example, a set 0, a set 1, a set 2, and a set 3 that are obtained from the remaining columns of the sub-block 0 respectively include symbols 1316 in column 16, symbols $B_{17}$ in column 17, symbols Ns in column 18, and symbols $B_{19}$ in column 19. In other words, the currently-to-be-sent set 0, the currently-to-be-sent set 1, the currently-to-be-sent set 2, and the currently-to-be-sent set 3 respectively include the symbols $B_{16}$ in column 16, the symbols $B_{17}$ in column 17, the symbols $B_{18}$ in column 18, and the symbols 919 in column 19. The set 0 to the set 3 respectively correspond to the communication link 0 to the communication link 3. The symbols $B_{16}$ in the to-be-sent set 0, the symbols $B_{17}$ in the to-be-sent set 1, the symbols 918 in the to-be-sent set 2, and the symbols $B_{19}$ in the to-be-sent set 3 are respectively sent over the communication link 0, the communication link 1, the communication link 2, and the communication link 3. z=3 is recorded.

In this embodiment of this application, FEC encoding is performed on the X symbol sets to obtain the X RS outer codes. For each RS outer code, less than or equal to (N1–K1)/2 symbols on which errors occur in the RS outer code can be corrected. FEC encoding is performed on the X RS outer codes to obtain the Y RS inner codes. For each RS inner code, less than or equal to (N2–K2)/2 symbols on which errors occur in the RS inner code can be corrected. After FEC encoding is performed on the data bitstream to obtain a plurality of RS outer codes, second-time FEC encoding is further performed on the RS outer codes to obtain an RS inner code. In this way, a quantity of symbols that can be corrected during decoding at the receive end can be increased, thereby improving error correction performance.

Figure 14:
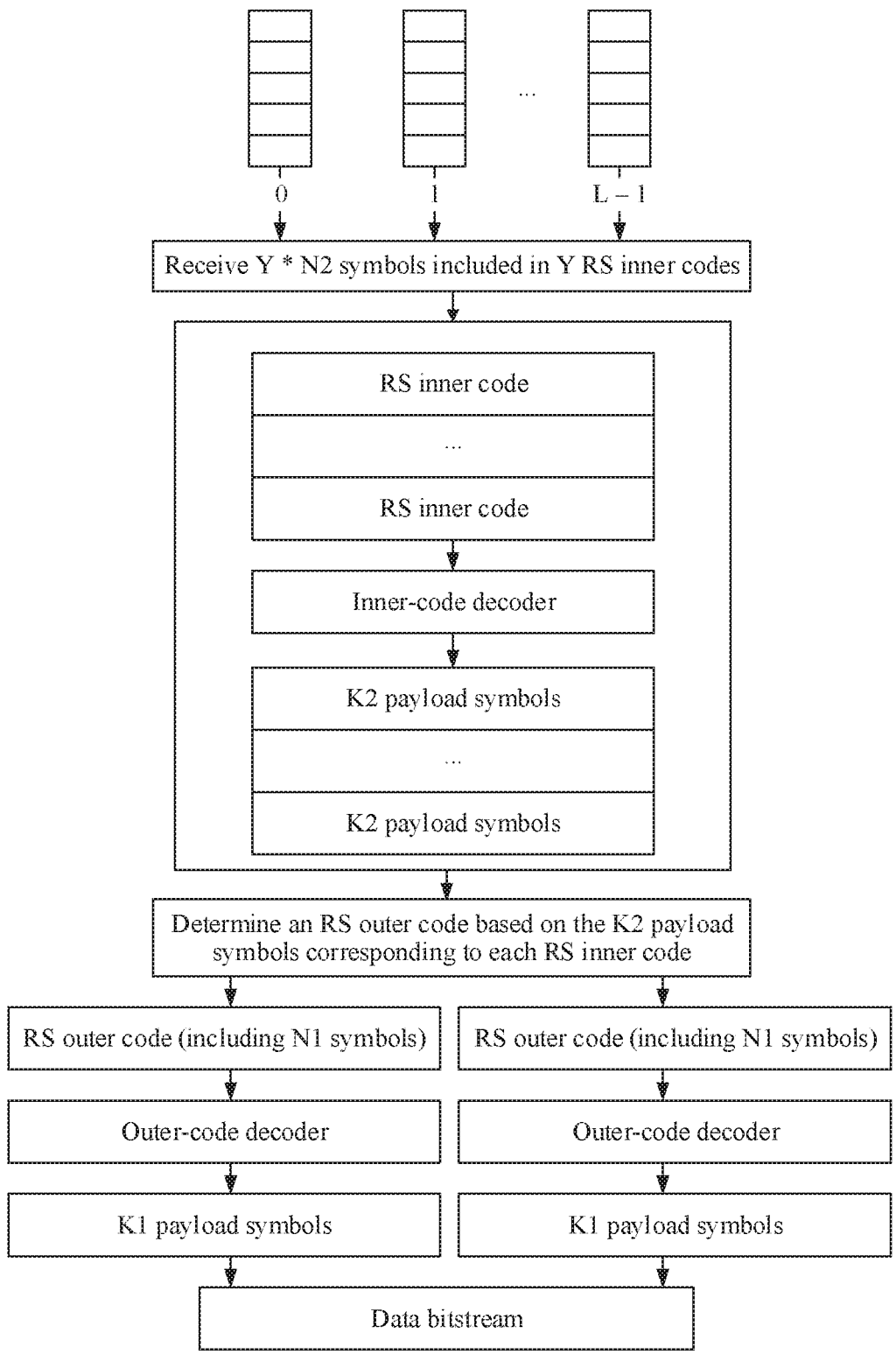
FIG. 14 is a flowchart of another decoding method according to an embodiment of this application.

Referring to FIG. 13 and FIG. 14, an embodiment of this application provides a decoding method. The method may be applied to a receive end, for example, may be applied to the switching device shown in FIG. 1. The receive end may be any line card other than a line card corresponding to the transmit end in the switching device or a chip on the line card other than the line card corresponding to the transmit end. The method includes the following steps.

Step 301: Receive, over L communication links, Y*N2 symbols included in Y RS inner codes, and obtain a sequence of receiving the received symbols.

For each communication link, reception is performed at a bit granularity over the communication link, and each time when m bits are received, the m bits constitute one symbol.

Optionally, the receive end may include a decision feedback equalizer (DFE) and a nonlinear error correction (NEC), and each received symbol may be processed by using the DFE and the NEC. When processing each received symbol, the DFE and the NEC obtain a symbol on which an error occurs.

Optionally, the receive end may further include an analog-to-digital converter (ADC), and each received symbol may be processed sequentially by using the ADC, the DFE, and the NEC.

Each received symbol has a same length and includes a plurality of bits. Therefore, each symbol may be divided into a plurality of equal-length segments, each segment includes at least two consecutive bits, a value of each segment is a value in a preset value set, and a signal amplitude of each segment is within a preset amplitude range. For example, it is assumed that each symbol includes eight bits, each segment obtained through division includes two consecutive bits, and a value of each segment is 0, 1, 2, or 3. Therefore, the preset value set includes 0, 1, 2 and 3. The preset amplitude range may be less than or equal to a minimum level value or greater than or equal to a maximum level.

Optionally, when the receive end receives a symbol, the receive end may obtain, in the following manner, a symbol on which an error occurs. The receive end divides the symbol into a plurality of equal-length segments; obtains a signal amplitude of each segment by using the DFE; determines, by using the NEC, whether the signal amplitude of each segment is within the preset amplitude range; and if a signal amplitude of a segment is not within the preset amplitude range, determines, by using the NEC, that an error occurs on the symbol.

Optionally, when the receive end receives a symbol, the receive end may obtain, in the following manner, a symbol on which an error occurs. The receive end divides the symbol into a plurality of equal-length segments; obtains a value of each segment by using the DFE; determines, by using the NEC, whether the value of each segment is within the preset value set; and if a value of a segment is not within the preset value set, determines, by using the NEC, that an error occurs on the symbol. For example, assuming that a symbol includes eight bits, the receive end divides the symbol into four segments, and obtains a value of each of the four segments; and if a value of a segment in the values of the four segments is not 0, 1, 2, or 3, determines, by using the NEC, that an error occurs on the symbol.

Step 302: Generate the Y RS inner codes based on each received symbol and the sequence of receiving the symbols, where each RS inner code includes N2 symbols, K2 of the N2 symbols are payload symbols, and N2>K2.

The transmit end and the receive end may pre-agree on a symbol sending policy. In this way, on the receive side, when receiving each symbol, the receive end obtains the sequence of receiving the symbols, and then generates RS inner codes based on the sequence of receiving the symbols.

Optionally, D RS inner codes may be generated each time, the D RS inner codes may constitute a matrix including D rows*N2 columns of symbols, each row represents one RS inner code, and each column includes D symbols with a same number.

N2 may be referred to as an inner-code length, K2 may be referred to as an inner-code information length, and each of the Y RS inner codes may be represented as RS (N2, K2).

Optionally, when L=1, that is, there is only one communication ink between the transmit end and the receive end, in this step, first, D symbols are received over the communication link, where D is an integer greater than 1, and the D symbols are used as symbols in column 0; then, D symbols are received over the communication link, and the D symbols as used as symbols in column 1; D symbols continue to be received over the communication link, and the D symbols are used as symbols in column 2; and the foregoing process is repeated until D symbols in column (N2–1) are obtained, so that N2 columns of symbols are obtained in total. Symbols in each row in the N2 columns of symbols are used as one RS inner code, so that D RS inner codes from row 0 to row (D–1) are obtained.

Next, D symbols continue to be received over the communication link, and the D symbols are used as symbols in column 0; D symbols continue to be received over the communication link, and the D symbols are used as symbols in column 1; and the foregoing process is repeated until D symbols in column (N2−1) are obtained, so that N2 columns of symbols are obtained in total. N2 symbols in each row are used as one RS inner code, so that D RS inner codes from row D to row (2*D−1) are obtained. The foregoing process is repeated to obtain different RS inner codes.

Optionally, when L is greater than 1 and X=1, in this step, first, D symbols are received over each communication link, and the D symbols received over each communication link are used as symbols in column 0 to column−1); then, D symbols are received over each communication link, and the D symbols received over each communication link are used as symbols in column L to column (2*L−1); and D symbols continue to be received over each communication link in the foregoing manner, to obtain a matrix including D rows*N2 columns of symbols. N2 symbols in each row are used as one RS inner code, so that D RS inner codes from row 0 to row (D−1) are obtained. The foregoing process is repeated to obtain different RS inner codes.

Optionally, when L is greater than 1 and X is greater than 1, assuming that the sending policy pre-agreed on by the transmit end and the receive end is the sending policy described in step 2044, in this step, different RS inner codes may be obtained by performing the following operations 3021 to 3024.

3021: Receive D symbols over all communication links for the first time, use the D symbols received over all the communication links as symbols in column 0 to column (L−1), and set z to 1, where z represents a number of a communication link over which symbols in column 0 are received next time.

For example, assuming that L=4, D symbols are received over a communication link 0 for the first time to obtain a column of symbols $B_0$, D symbols are received over a communication link 1 for the first time to obtain a column of symbols $B_1$. D symbols are received over a communication link 2 for the first time to obtain a column of symbols 132, and D symbols are received over a communication link 3 for the first time to obtain a column of symbols $B_3$, $B_0$, $B_1$, $B_2$, and $B_3$ are used as symbols in column 0 to column 3 of a matrix.

3022: Receive D symbols over each communication link, to obtain a column of symbols corresponding to the communication link.

For example, D symbols are received over the communication link 0 to obtain a column of symbols $B_7$, D symbols are received over the communication link 1 to obtain a column of symbols $B_4$, D symbols are received over the communication link 2 to obtain a column of symbols $B_5$, and D symbols are received over the communication link 3 to obtain a column of symbols $B_6$.

3023: Respectively determine a column of symbols corresponding to a communication link z to a column of symbols corresponding to a communication link (L−1) as symbols in column 0 to column (L−z−1), and respectively determine a column of symbols corresponding to the communication link 0 to a column of symbols corresponding to a communication link (z−1) as symbols in column (L−z) to column (L−1).

For example, the column of symbols $B_4$ corresponding to the communication link 1, the column of symbols $B_5$ corresponding to the communication link 2, and the column of symbols $B_6$ corresponding to the communication link 3 are respectively determined as symbols in column 0 to column 2, and the column of symbols $B_7$ corresponding to the communication link 0 as symbols in column 3.

3024: Use the symbols in column 0 to column (L−1) as L consecutive columns of symbols; and when z is less than L−1, set z=z+1, and go back to perform 3022, or when z=L−1, set z=0, and go back to perform 3022.

Based on the foregoing process, each time when a matrix including D rows*N2 columns of symbols is obtained. N2 symbols in each row are used as one RS inner code, so that D RS inner codes from row 0 to row (D−1) are obtained. The foregoing process is repeated to obtain different RS inner codes.

For example, $B_4$ in column 0, $B_5$ in column 1, $B_6$ in column 2, and $B_7$ in column 3 may be respectively used as symbols in column 4 to column 7 of the matrix, and z=2 is set.

Next, D symbols are received over the communication link 0 to obtain a column of symbols $B_{10}$, D symbols are received over the communication link 1 to obtain a column of symbols $B_{11}$, D symbols are received over the communication link 2 to obtain a column of symbols $B_8$, and D symbols are received over the communication link 3 to obtain a column of symbols $B_9$. The column of symbols $B_8$ corresponding to the communication link 2 and the column of symbols $B_9$ corresponding to the communication link 3 are respectively determined as symbols in column 0 and column 1, and the column of symbols $B_{10}$ corresponding to the communication link 0 and the column of symbols Bit corresponding to the communication link 1 are respectively determined as symbols in column 2 and column 3. The symbols $B_8$ in column 0, the symbols $B_9$ in column 1, the symbols $B_{10}$ in column 2, and the symbols $B_{11}$ in column 3 are respectively used as symbols in column 8 to column 11 of the matrix, and z=3 is set.

Next, D symbols are received over the communication link 0 to obtain a column of symbols $B_{13}$, D symbols are received over the communication link 1 to obtain a column of symbols $B_{14}$, D symbols are received over the communication link 2 to obtain a column of symbols $B_{15}$, and D symbols are received over the communication link 3 to obtain a column of symbols $B_{12}$. The column of symbols $B_{12}$ corresponding to the communication link 3 is determined as symbols in column 0. The column of symbols $B_{13}$ corresponding to the communication link 0, the column of symbols $B_{14}$ corresponding to the communication link 1, and the column of symbols $B_{13}$ corresponding to the communication link 2 are respectively determined as symbols in column 1 to column 3. The symbols $B_{12}$ in column 0, the symbols $B_{13}$ in column 1, the symbols $B_{14}$ in column 2, and the symbols $B_{15}$ in column 3 are respectively used as symbols in column 12 to column 15 of the matrix, and z=0 is set.

Next, D symbols are received over the communication link 0 to obtain a column of symbols $B_{16}$, D symbols are received over the communication link 1 to obtain a column of symbols $B_{17}$, D symbols are received over the communication link 2 to obtain a column of symbols $B_{18}$, and D symbols are received over the communication link 3 to obtain a column of symbols $B_{19}$. The column of symbols $B_{16}$ corresponding to the communication link 0, the column of symbols $B_{17}$ corresponding to the communication link 1, the column of symbols Bis corresponding to the communication link 2, and the column of symbols $B_{19}$ corresponding to the communication link 3 are respectively determined as symbols in column 0 to column 3. The symbols $B_{16}$ in column 0, the symbols $B_{17}$ in column 1, the symbols Bis in column 2, and the symbols $B_{19}$ in column 3 are respectively used as symbols in column 16 to column 19 of the matrix, and z=1 is set.

The foregoing operations are repeated to obtain symbols in column 20 to column 33 of the matrix, and each row of 34 symbols included in the matrix is used as one RS inner code.

Step 303: Perform FEC decoding on the Y RS inner codes to obtain X RS outer codes, where each RS outer code includes N1 symbols, K1 of the N1 symbols are payload symbols, and N1>K1.

Optionally, N1>K1>N2, and X=(Y*K2)/N1. N1 and K1 are integers greater than 1, and X is an integer greater than 0. Each of the X RS outer codes may be represented as RS (N1, K1).

In this step, FEC decoding is performed on the Y RS inner codes based on an inner-code length N2 and an inner-code information length K2 to obtain the X RS outer codes. Optionally, the X RS outer codes may be obtained by performing the following steps 3031 and 3032.

Perform FEC decoding on each of the Y RS inner codes, to obtain K2 payload symbols included in each RS inner code.

Optionally, the receive end may include one or more inner-code decoders. Optionally, the inner-code decoder may be an RS FEC inner-code decoder.

For each inner-code decoder, when performing decoding one time, the inner-code decoder may perform FEC decoding on N2 symbols included in one RS inner code to obtain K2 payload symbols.

In this step, when the receive end includes one inner-code decoder, FEC decoding is performed, by using the inner-code decoder, on N2 symbols in one RS inner code to obtain K2 payload symbols. The foregoing process is repeated to perform FEC decoding on different RS inner codes, to obtain K2 payload symbols included in each of the different RS inner codes.

When the receive end includes a plurality of inner-code decoders, FEC decoding is performed, by using each of the plurality of inner-code decoders, on N2 symbols included in each of RS inner codes, to obtain K2 payload symbols included in each of the plurality of RS inner codes. The foregoing process is repeated to perform FEC decoding on different RS inner codes, to obtain K2 payload symbols included in each of the different RS inner codes.

For each RS inner code, the last (N2−K2) symbols in the RS inner code are redundant symbols, the inner-code decoder may correct, based on the (N2−K2) redundant symbols, a symbol on which an error occurs in the RS inner code, where a quantity of symbols that can be corrected is less than or equal to (N2−K2)/2.

Optionally, in a process of receiving a symbol, a symbol on which an error occurs may be further obtained. In this step, because the symbol on which an error occurs has been obtained, specific symbols on which errors occur in each RS inner code may be learned, locations of the symbols on which errors occur in the RS inner code are obtained, and FEC decoding may be performed on the RS inner code based on the locations of the symbols on which errors occur. After the locations of the symbols on which errors occur are introduced, a quantity of symbols on which errors occur in the RS inner code that are corrected by the inner-code decoder may be less than or equal to N2−K2. In this way, error correction performance is improved.

For each RS inner code, a symbol sequence of the RS inner code is: $(c_0, c_1, c_2, c_3, \ldots, c_{N2-1})$, and correspondingly, a codeword polynomial of the RS inner code may be: $C_{N2,K2}(x) = c_0 + c_1 \cdot x + c_2 \cdot x^2 + \ldots + c_{N2} \cdot x^{N2-1}$. An error is introduced during transmission of the RS inner code over a communication link. A sequence in which an error occurs is defined as $(e_0, e_1, e_2, \ldots, e_{N2-1})$, where $e_0, e_1, e_2, \ldots, e_{N2-1}$ are error values corresponding to symbols $c_0, c_1, c_2, c_3, \ldots, c_{N2-1}$. If an error value corresponding to a symbol is 0, it indicates that no error occurs on the symbol during transmission over the communication link; and if an error value corresponding to a symbol is not 0, it indicates that an error occurs on the symbol during transmission over the communication link. There are v error values that are not 0 in the sequence in which an error occurs, that is, there are a quantity v of symbols on which errors occur in the RS inner code, a polynomial, in which an error occurs, corresponding to the sequence in which an error occurs is: $E(x) = e_{i_1} \cdot x^{i_1} + e_{i_2} \cdot x^{i_2} + \ldots + e_{i_v} \cdot x^{i_v}$, where $i_1, i_2, \ldots, i_v$ represent locations of symbols on which errors occur. In this way, it may be obtained that a received polynomial of the RS inner code is: $Rx(x) = C_{N2,K2}(x) + E(x)$. An error correction capability of the inner-code decoder is: $t = (N2-K2)/2$, that is, a quantity of corrected symbols on which errors occur is t. If $\alpha$ is assumed to be a root of the polynomial, the following third formula may be obtained.

The third formula is:

$$\begin{cases} C_{N,K}(\alpha^i) = 0, i = 0, 1, 2, \ldots, 2t-1 \\ S_i = Rx(\alpha^i) = e_{i_1} \cdot (\alpha^i)^{i_1} + e_{i_2} \cdot (\alpha^i)^{i_2} + \ldots + e_{i_v} \cdot (\alpha^i)^{i_v} \end{cases}$$

If it is defined that $X_j = \alpha^{i_j}$, $j=1, 2, \ldots, v$, the third formula may be equivalent to the following fourth formula:

$$\begin{cases} S_0 = e_{i_1} \cdot X_1^0 + e_{i_2} \cdot X_2^0 + \ldots + e_{i_v} \cdot X_v^0 \\ S_1 = e_{i_1} \cdot X_1^1 + e_{i_2} \cdot X_2^1 + \ldots + e_{i_v} \cdot X_v^1 \\ \ldots \\ S_{2t-1} = e_{i_1} \cdot X_1^{2t-1} + e_{i_2} \cdot X_2^{2t-1} + \ldots + e_{i_v} \cdot X_v^{2t-1} \end{cases}$$

The fourth formula is:

The fourth formula indicates a system of a total of 2t independent linear equations. If $v \leq 2t$, $e_{i_1}, e_{i_2}, \ldots, e_{i_v}$ may be uniquely determined. Therefore, a maximum of 2t errors can be corrected based on locations of symbols on which errors occur. Therefore, the quantity of symbols on which errors occur corrected by the inner-code decoder changes from a quantity less than or equal to t to a quantity less than or equal to 2t, that is, a quantity less than or equal to N2−K2.

3032: Determine the X RS outer codes based on the K2 payload symbols corresponding to each RS inner code.

Optionally, for each symbol included in each of the X RS outer codes, based on a number h of an RS inner code to which the symbol belongs and a number c of the symbol in the RS inner code h, a number j of an RS outer code to which the symbol belongs and a number i of the symbol in the RS outer code j are determined according to the following second formulas, where h=0, 1, . . . , Y−1, and c=0, 1, . . . , K2−1.

The second formulas are: j=(h*K2+c) MOD X and i=floor ((h*K2+c)/X), where floor represents a rounding down operation, and MOD represents a modulo operation.

Step 304: Perform FEC decoding on the X RS outer codes to obtain K1 payload symbols corresponding to each RS outer code.

Optionally, the receive end may include one or more outer-code decoders. Optionally, the outer-code decoder may be an RS FEC outer-code decoder.

For each outer-code decoder, when performing decoding one time, the outer-code decoder may perform FEC decoding on N1 symbols included in one RS outer code, to obtain K1 payload symbols.

In this step, when the receive end includes one outer-code decoder, FEC decoding is performed, by using the outer-code decoder, on N1 symbols included in one RS inner code, to obtain K1 payload symbols. The foregoing process is repeated to perform FEC decoding on different RS outer codes.

When the receive end includes a plurality of outer-code decoders, FEC encoding is performed on N1 symbols in each of RS outer codes by using each of the plurality of outer-code decoders, to obtain K1 payload symbols corresponding to each of the plurality of RS outer codes. The foregoing process is repeated to perform FEC decoding on different RS outer codes.

A quantity of outer-code decoders in the receive end may be equal to X, or may be less than X. When the quantity of outer-code decoders is less than X, FEC decoding is performed for a plurality of times until the X RS outer codes are decoded.

For each RS outer code, the last (N1−K1) symbols in the RS outer code are redundant symbols, the outer-code decoder may correct, based on the (N1−K1) redundant symbols, a symbol on which an error occurs in the RS inner code, where a quantity of symbols that can be corrected is less than or equal to (N1−K1)/2.

Optionally, in a process of receiving a symbol, a symbol on which an error occurs may be further obtained. In this step, because the symbol on which an error occurs has been obtained, specific symbols on which errors occur in each RS outer code may be learned, locations of the symbols on which errors occur in the RS outer code are obtained, and FEC decoding may be performed on the RS outer code based on the locations of the symbols on which errors occur.

In this way, the outer-code decoder may perform FEC decoding on the RS outer code based on the locations of the symbols on which errors occur. After the locations of the symbols on which errors occur are introduced, a quantity of symbols on which errors occur in the RS outer code that are corrected by the outer-code decoder may be less than or equal to N1−K1. In this way, error correction performance is improved.

After the locations of the symbols on which errors occur are introduced, for detailed analysis of how to improve the error correction performance of the outer-code decoder, refer to detailed analysis of how to improve the error correction performance of the inner-code decoder. Details are not described herein again.

Optionally, when the K1 payload symbols are obtained, because each payload symbol includes m bits, the symbols are sent to a communications network at a bit granularity starting from the first bit of the first payload symbol.

In this embodiment of this application, FEC decoding is performed on the Y RS inner codes to obtain the X RS outer codes. For each RS inner code, less than or equal to (N2−K2)/2 symbols on which errors occur in the RS inner code can be corrected. FEC decoding is performed on the X RS outer codes. For each RS outer code, less than or equal to (N1−K1)/2 symbols on which errors occur in the RS outer code can be corrected. In this way, FEC decoding is performed twice, so that error correction performance is improved. When locations of the symbols on which errors occur in the RS inner code are introduced, less than or equal to (N2−K2) symbols on which errors occur in the RS inner code can be corrected. When locations of the symbols on which errors occur in the RS outer code are introduced, less than or equal to (N1−K1) symbols on which errors occur in the RS outer code can be corrected. This further improves error correction performance.

Figure 15:
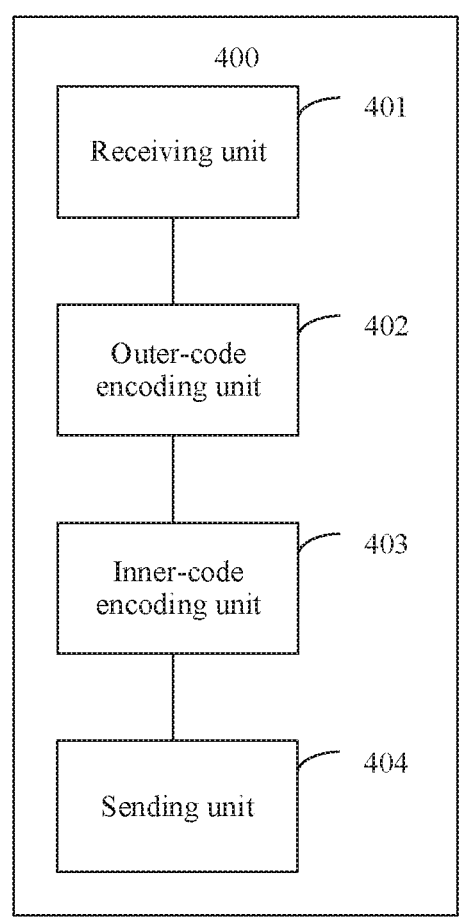
FIG. 15 is a structural diagram of an encoding apparatus according to an embodiment of this application.

Referring to FIG. 15, an embodiment of this application provides an encoding apparatus 400. The apparatus 400 may be deployed on a line card of the switching device shown in FIG. 1, and can be configured to perform the encoding method provided in the foregoing embodiment. The apparatus 400 includes:

a receiving unit 401, configured to receive a data bitstream;

an outer-code encoding unit 402, configured to perform forward error correction FEC encoding on the data bitstream to obtain. X Reed-Solomon RS outer codes, where each of the X RS outer codes includes N1 symbols, K1 of the N1 symbols are payload symbols, N1>K1, N1 and K1 are integers greater than 1, and X is an integer greater than 0; and an inner-code encoding unit 403, configured to perform FEC encoding on the X RS outer codes to obtain Y RS inner codes, where each of the Y RS inner codes includes N2 symbols, K2 of the N2 symbols are payload symbols, N2 K2, N2 and K2 are integers greater than 0, Y is an integer greater than 1, and N1>N2.

Optionally, $Y=(X*N1)/K2$.

Optionally, N1=544, K1=514, N2=34, and K2=32; or N1=544, K1=514, N2=36, and K2=34.

Optionally, when X is greater than or equal to 2, any two adjacent payload symbols in each RS inner code belong to different RS outer codes.

Optionally, when X is greater than or equal to 2, any two adjacent payload symbols that belong to a same RS outer code and that are in each RS inner code are separated by (X−1) symbols.

Optionally, the inner-code encoding unit 403 is configured to:

for each of the Y RS inner codes, determine K2 payload symbols included in the RS inner code: and perform FEC encoding on the K2 payload symbols to obtain the RS inner code that includes N2 symbols.

Optionally, the inner-code encoding unit 403 is configured to:

for each of the K2 payload symbols, based on a number j of an RS outer code to which the payload symbol belongs and a number i of the payload symbol in the RS outer code j, determine, according to the following first formulas, a number h of an RS inner code to which the payload symbol belongs and a number c of the payload symbol in the RS inner code h, where j=0, 1, X−1, and i=0, 1, . . . , N1−1, where the first formulas are: $h=\text{floor}((i*X+j)/K2)$ and $c=(i*X+j)\text{MOD}K2$, where floor represents a rounding down operation, and MOD represents a modulo operation.

Optionally, the apparatus 400 further includes a sending unit 404, where the sending unit 404 is configured to send, over L communication links, Y*N2 symbols included in the Y RS inner codes, where L is an integer greater than 0.

Optionally, for symbols sent over a same communication link, any two adjacent symbols belong to different RS inner codes.

Optionally, for symbols sent over a same communication link, any two adjacent symbols that belong to a same RS inner code are separated by (D−1) symbols, where D is an integer greater than 1, and D<Y.

Specific technical features related to the encoding apparatus 400 have been described in detail in the foregoing method embodiment. For details, refer to the descriptions in the foregoing method embodiment. Details are not described herein again.

In this embodiment of this application, outer-code encoding unit performs FEC encoding on the data bitstream to obtain the X RS outer codes. For each RS outer code, a receive end can correct less than or equal to (N1−K1)/2 symbols on which errors occur in the RS outer code. The inner-code encoding unit performs FEC encoding on the X RS outer codes to obtain the Y RS inner codes. For each RS inner code, the receive end can correct less than or equal to (N2−K2)/2 symbols on which errors occur in the RS inner code. In this way, FEC encoding is performed twice, thereby improving error correction performance.

Figure 16:
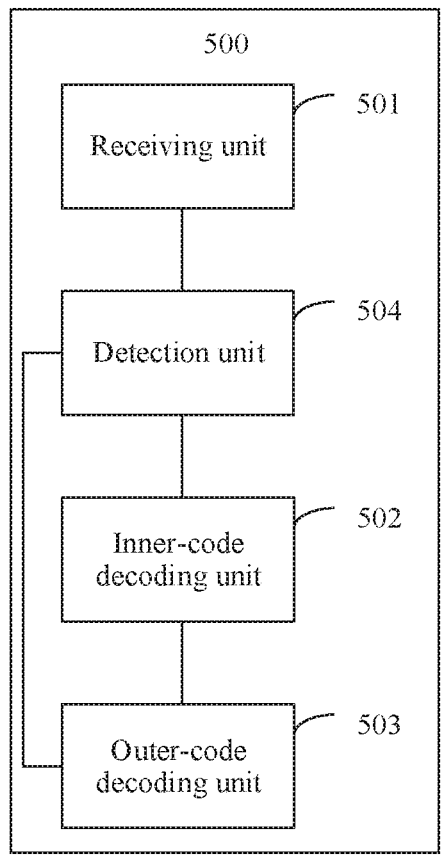
FIG. 16 is a structural diagram of a decoding apparatus according to an embodiment of this application.

Referring to FIG. 16, an embodiment of this application provides a decoding apparatus 500. The apparatus 500 may be deployed on a line card of the switching device shown in FIG. 1, and can be configured to perform the decoding method provided in the foregoing embodiment. The apparatus 500 includes:

a receiving unit 501, configured to receive Y Reed-Solomon RS inner codes, where each of the Y RS inner codes includes N2 symbols, K2 of the N2 symbols are payload symbols, N2>K2. N2 and K2 are integers greater than 0, and Y is an integer greater than 1;

an inner-code decoding unit 502, configured to perform forward error correction FEC decoding on the Y RS inner codes to obtain X RS outer codes, where each of the X RS outer codes includes N1 symbols, K1 of the N1 symbols are payload symbols, N1>K1, N1>N2, N1 and K1 are integers greater than 1, and X is an integer greater than 0; and an outer-code decoding unit 503, configured to perform FEC decoding on the X RS outer codes to obtain K1 payload symbols corresponding to each RS outer code.

Optionally, $X=(Y*K2)/N1$.

Optionally, N1=544, K1=514, N2=34, and K2=32; or N1=544, K1=514, N2=36, and K2=34.

Optionally, when X is greater than or equal to 2, any two adjacent payload symbols in each RS inner code belong to different RS outer codes.

Optionally, when X is greater than or equal to 2, any two adjacent payload symbols that belong to a same RS outer code and that are in each RS inner code are separated by (X−1) symbols.

Optionally, the inner-code decoding unit 502 is configured to:

perform FEC decoding on each of the Y RS inner codes, to obtain the K2 payload symbols corresponding to each RS inner code; and determine the X RS outer codes based on the K2 payload symbols corresponding to each RS inner code.

Optionally, the inner-code decoding unit 502 is configured to:

obtain a location of a symbol on which an error occurs in a target RS inner code, where the target RS inner code is any one of the Y RS inner codes; and perform, based on the location of the symbol on which an error occurs in the target RS inner code, FEC decoding on N2 symbols included in the target RS inner code, to obtain K2 payload symbols corresponding to the target RS inner code.

Optionally, the outer-code decoding unit 503 is configured to:

for each symbol included in each of the X RS outer codes, based on a number h of an RS inner code to which the symbol belongs and a number c of the symbol in the RS inner code h, determine, according to the following second formulas, a number j of an RS outer code to which the symbol belongs and a number i of the symbol in the RS outer code j, where h=0, 1, . . . , Y−1, and c=0, 1, . . . , K2−1, where the second formulas are: j=(h*K2+c) MOD X and i=floor ((h*K2±c)/X), where floor represents a rounding down operation, and MOD represents a modulo operation.

Optionally, the outer-code decoding unit 503 is configured to:

obtain a location of a symbol on which an error occurs in a target RS outer code, where the target RS outer code is any one of the X RS outer codes; and perform FEC decoding on the target RS outer code based on the location of the symbol on which an error occurs in the target RS outer code, to obtain the K1 payload symbols corresponding to the target RS outer code.

Optionally, the apparatus 500 further includes:

a detection unit 504, configured to: detect a received symbol, where the symbol includes a plurality of segments; and when detecting that a signal amplitude of a segment in the symbol is not within a preset amplitude range or when detecting that a value of a segment in the symbol is not within a preset value set, determine that the symbol is a symbol on which an error occurs, where the preset value set includes a plurality of preset values.

In this embodiment of this application, the inner-code decoding unit performs FEC decoding on the Y RS inner codes to obtain the X RS outer codes. For each RS inner code, less than or equal to (N2−K2)/2 symbols on which errors occur in the RS inner code can be corrected. The outer-code decoding unit performs FEC decoding on the X RS outer codes. For each RS outer code, less than or equal to (N1−K1)/2 symbols on which errors occur in the RS outer code can be corrected. In this way, error correction performance is improved.

Figure 17:
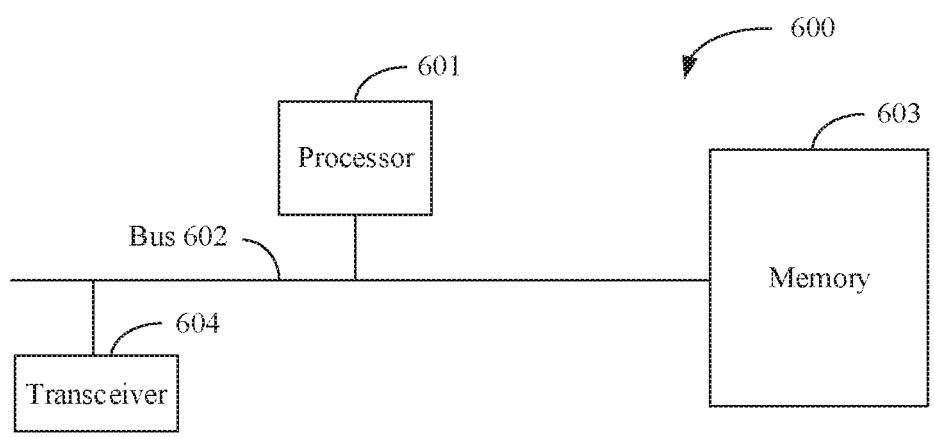
FIG. 17 is a structural diagram of another encoding apparatus according to an embodiment of this application.

FIG. 17 is a schematic diagram of an encoding apparatus 600 according to an embodiment of this application. The apparatus 600 includes at least one processor 601, a bus 602, a memory 603, and at least one transceiver 604.

Optionally, the at least one processor 601, the bus 602, the memory 603, and the at least one transceiver 604 may be integrated into a PCB. The at least one processor 601 may be a chip on the PCB, the bus 602 may be a PCB trace on the PCB, and the at least one transceiver 604 may be integrated into a communications interface and/or backplane connector of the PCB.

The apparatus 600 is an apparatus of a hardware structure, and can be configured to implement functional modules in the apparatus in FIG. 15. For example, the outer-code encoding unit 402 and the inner-code encoding unit 403 in the apparatus 400 shown in FIG. 15 can be implemented by the at least one processor 601 by invoking code in the memory 603. The receiving unit 401 and the sending unit 404 in the apparatus 400 shown in FIG. 15 can be implemented by the transceiver 604.

Optionally, the apparatus 600 may be further configured to implement a function of the transmit end in any one of the foregoing embodiments.

Optionally, the processor 601 may be a general-purpose central processing unit (CPU), a microprocessor, an application-specific integrated circuit (ASIC), or one or more integrated circuits configured to control program execution of the solutions of this application.

The bus 602 may include a path for information transmission between the foregoing components.

The transceiver 604 is configured to communicate with another device or a communications network.

The memory 603 may be a read-only memory (ROM), another type of static storage device that can store static information and an instruction, a random access memory (RAM), or another type of dynamic storage device that can store information and an instruction, or may be an electrically erasable programmable read-only memory (EEPROM) or the like. The memory may exist independently, and is connected to the processor through the bus. The memory may alternatively be integrated with the processor.

The memory 603 is configured to store application program code for executing the solutions in this application, and the processor 601 controls the execution. The processor 601 is configured to execute the application program code stored in the memory 603, to implement a function in the encoding method in this application.

In specific implementation, in an embodiment, the processor 601 may include one or more CPUs, for example, a CPU 0 and a CPU 1 in FIG. 17.

In specific implementation, in an embodiment, each of the at least one processor 601 may be a single-core (single-CPU) processor, or may be a multi-core (multi-CPU) processor. The processor 601 herein may be one or more devices, circuits, and/or processing cores for processing data (for example, a computer program instruction).

Figure 18:
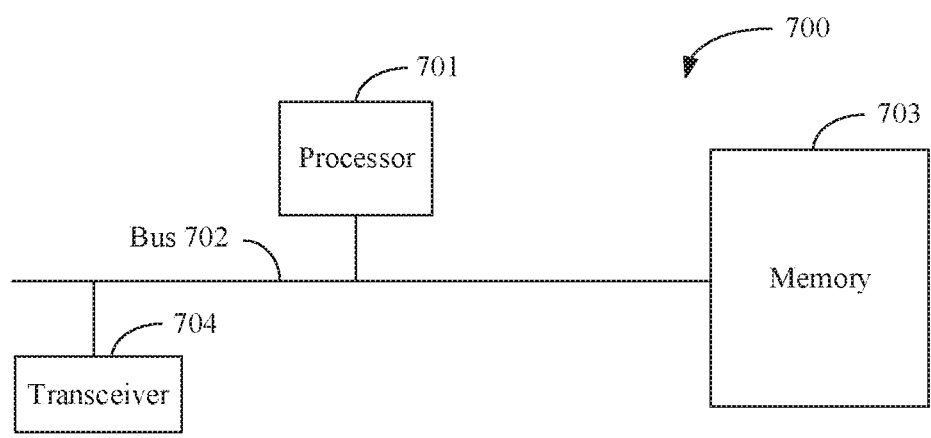
FIG. 18 is a structural diagram of another decoding apparatus according to an embodiment of this application.

FIG. 18 is a schematic diagram of an encoding apparatus 700 according to an embodiment of this application. The apparatus 700 includes at least one processor 701, a bus 702, a memory 703, and at least one transceiver 704.

Optionally, the at least one processor 701, the bus 702, the memory 703, and the at least one transceiver 704 may be integrated into a PCB. The at least one processor 701 may be a chip on the PCB, the bus 702 may be a PCB trace on the PCB, and the at least one transceiver 704 may be integrated into a communications interface and/or a backplane connector of the PCB.

The apparatus 700 is an apparatus of a hardware structure, and can be configured to implement functional modules in the apparatus in FIG. 16. For example, the inner-code decoding unit 502, the outer-code decoding unit 503, and the detection unit 504 in the apparatus 500 shown in FIG. 16 may be implemented by the at least one processor 701 by invoking code in the memory 703. The receiving unit 501 in the apparatus 500 shown in FIG. 16 may be implemented by the transceiver 704.

Optionally, the apparatus 700 may be further configured to implement a function of the receive end in any one of the foregoing embodiments.

Optionally, the processor 701 may be a general-purpose central processing unit (CPU), a microprocessor, an application-specific integrated circuit (ASIC), or one or more integrated circuits configured to control program execution of the solutions of this application.

The bus 702 may include a path for information transmission between the foregoing components.

The transceiver 704 is configured to communicate with another device or a communications network.

The memory 703 may be a read-only memory (ROM), another type of static storage device that can store static information and an instruction, a random access memory (RAM), or another type of dynamic storage device that can store information and an instruction, or may be an electrically erasable programmable read-only memory (EEPROM) or the like. The memory may exist independently, and is connected to the processor through the bus. The memory may alternatively be integrated with the processor.

The memory 703 is configured to store application code for executing the solutions in this application, and the processor 701 controls the execution. The processor 701 is configured to execute the application program code stored in the memory 703, to implement a function in the encoding method in this application.

In specific implementation, in an embodiment, the processor 701 may include one or more CPUs, for example, a CPU 0 and a CPU 1 in FIG. 18.

In specific implementation, in an embodiment, each of the at least one processor 701 may be a single-core (single-CPU) processor, or may be a multi-core (multi-CPU) processor. The processor 701 herein may be one or more devices, circuits, and/or processing cores for processing data (for example, a computer program instruction).

Figure 19:
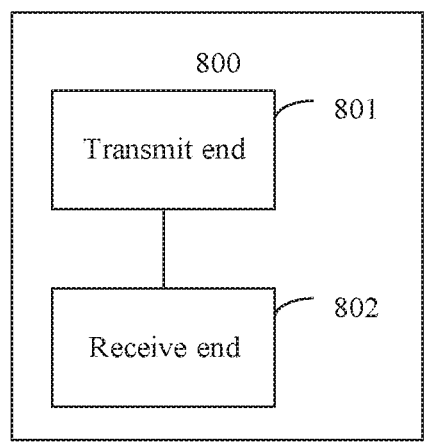
FIG. 19 is a structural diagram of an encoding and decoding system according to an embodiment of this application.

Referring to FIG. 19, an embodiment of this application provides an encoding and decoding system 800. The system 800 includes the apparatus shown in FIG. 15 and the apparatus shown in FIG. 16. Alternatively, the system 800 includes the apparatus shown in FIG. 17 and the apparatus shown in FIG. 18.

Optionally, the apparatus shown in FIG. 15 or FIG. 17 may be a transmit end 801, and the apparatus shown in FIG. 16 or FIG. 18 may be a receive end 802.

All or some of the foregoing embodiments may be implemented by using software, hardware, firmware, or any combination thereof. When software is used to implement the embodiments, the embodiments may be all or partially implemented in a form of a computer program product. The computer program product includes one or more computer instructions. When the computer program instructions are loaded and executed on a computer, the procedure or functions according to the embodiments of this application are all or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state drive (SSD)), or the like.

The foregoing descriptions are merely optional embodiments of this application, but are not intended to limit this application. Any modification, equivalent replacement, or improvement made without departing from the spirit and principle of this application should fall within the protection scope of this application.

What is claimed is:

1. A method for information encoding for performing wireless communications, the method comprising:

receiving, by a first communications device in a communications network, a data bitstream from a second communications device in the communications network;

performing, by the first communications device, forward error correction (FEC) encoding on the data bitstream to obtain X Reed-Solomon (RS) outer codes, wherein each of the X RS outer codes comprises N1 symbols, K1 of the N1 symbols are payload symbols, N1>K1, N1 and K1 are integers greater than 1, and X is a positive integer; and performing, by the first communications device, FEC encoding on the X RS outer codes to obtain Y RS inner codes, wherein each of the Y RS inner codes comprises N2 symbols, K2 of the N2 symbols are payload symbols, N2>K2, N2 and K2 are positive integers, Y is an integer greater than 1, and N1>N2.

2. The method according to claim 1, wherein Y=(X*N1)/K2.

3. The method according to claim 1, wherein N1=544, K1=514, N2=34, and K2=32 or 34.

4. The method according to claim 1, wherein X is greater than or equal to 2, any two adjacent payload symbols in each RS inner code belong to different RS outer codes.

5. The method according to claim 4, wherein X is greater than or equal to 2, any two adjacent payload symbols that belong to a same RS outer code are separated by (X−1) symbols in each RS inner code.

6. The method according to claim 5, wherein the performing the FEC encoding comprises:

for each of the Y RS inner codes, determining K2 payload symbols in the RS inner code; and performing, by the first communications device, the FEC encoding on the K2 payload symbols to obtain the N2 symbols of each of the Y RS inner codes.

7. The method according to claim 6, wherein the determining the K2 payload symbols comprises:

for each of the K2 payload symbols, based on an index number j of an RS outer code j that the payload symbol belongs and an index number i of the payload symbol in the RS outer code j, determining, by the first communications device according to a set of equations, an index number h of an RS inner code h that the payload symbol belongs and an index number c of the payload symbol in the RS inner code h, wherein j=0, 1, . . . , X−1, and i=0, 1, . . . , N1−1, and the set of equations comprises: h=floor((i X+j)/K2) and c=X+j) MOD K2, and wherein floor( ) represents a rounding down operation, and MOD represents a modulo operation.

8. The method according to claim 7, further comprising: sending, by the first communications device over L communication links, Y*N2 symbols comprised in the Y RS inner codes, wherein L is a positive integer.

9. The method according to claim 8, wherein for symbols sent over a same communication link of the L communication links, two adjacent symbols that belong to different RS inner codes.

10. The method according to claim 7, wherein for symbols sent over a same communication link of the L communication links, two adjacent symbols that belong to a same RS inner code are separated by (D−1) symbols, wherein D is an integer greater than 1, and D<Y.

11. A method for information decoding for performing wireless communications, the method comprising:

receiving, by a first communications device in a communications network, Y Reed-Solomon (RS) inner codes from a second communications device in the communications network, wherein each of the Y RS inner codes comprises N2 symbols, K2 of the N2 symbols are payload symbols, N2>K2, N2 and K2 are positive integers, and Y is an integer greater than 1;

performing, by the first communications device, forward error correction (FEC) decoding on the Y RS inner codes to obtain X RS outer codes, wherein each of the X RS outer codes comprises N1 symbols, K1 of the N1 symbols are payload symbols, N1>K1, N1>N2, N1 and K1 are integers greater than 1, and X is a positive integer; and performing, by the first communications device, FEC decoding on the X RS outer codes to obtain K1 payload symbols corresponding to each RS outer code.

12. The method according to claim 11, wherein X=(Y*K2)/N1.

13. The method according to claim 11, wherein N1=544, K1=514, N2=34, and K2=32 or 34.

14. The method according to claim 11, wherein X is greater than or equal to 2, any two adjacent payload symbols in each RS inner code belong to different RS outer codes.

15. The method according to claim 14, wherein X is greater than or equal to 2, any two adjacent payload symbols that belong to a same RS outer code are separated by (X−1) symbols in each RS inner code.

16. The method according to claim 15, wherein the performing the FEC decoding comprises:

performing, by the first communications device, FEC decoding on each of the Y RS inner codes to obtain the K2 payload symbols corresponding to the RS inner code; and determining, by the first communications device, the X RS outer codes based on the K2 payload symbols corresponding to each RS inner code.

17. The method according to claim 16, wherein the performing FEC decoding on each of the Y RS inner codes comprises:

determining, by the first communications device, a location of a symbol on which an error occurs in a target RS inner code of the Y RS inner codes; and performing; by the first communications device, based on the location of the symbol, FEC decoding on N2 symbols comprised in the target RS inner code, to obtain K2 payload symbols corresponding to the target RS inner code.

18. The method according to claim 16, wherein the determining the X RS outer codes comprises:

for each symbol comprised in each of the X RS outer codes, based on an index number h of an RS inner code h that the symbol belongs and an index number c of the symbol in the RS inner code h, determining, by the first communications device, according to a set of equations, an index number j of an RS outer code j that the symbol belongs and a number i of the symbol in the RS outer code j, wherein h=0, 1, . . . , Y−1, and c=0, 1, . . . , K2−1, and the set of equations comprises: j=(h*K2+c) MOD X and i=floor((h*K2+c)/X), wherein floor( ) represents a rounding down operation, and MOD represents a modulo operation.

19. The method according to claim 18, wherein the performing FEC decoding on the X RS outer codes comprises:

obtaining, by the first communications device, a location of a symbol on which an error occurs in a target RS outer code of the X RS outer codes; and performing, by the first communications device, FEC decoding on the target RS outer code based on the location of the symbol, to obtain the K1 payload symbols corresponding to the target RS outer code.

20. An apparatus, comprising:
a receiver, configured to receive a data bitstream from a communications device in a communications network;
at least one processor; and
a non-transitory computer-readable storage medium coupled to the at least one processor and storing programming instructions for execution by the at least one processor, the programming instructions instruct the at least one processor to:
perform forward error correction (FEC) encoding on the data bitstream to obtain X Reed-Solomon (RS) outer codes, wherein each of the X RS outer codes comprises N1 symbols, K1 of the N1 symbols are payload symbols, N1>K1, N1 and K1 are integers greater than 1, and X is a positive integer; and
perform EEC encoding on the X RS outer codes to obtain Y RS inner codes, wherein each of the Y RS inner codes comprises N2 symbols, K2 of the N2 symbols are payload symbols, N2>K2, N2 and K2 are positive integers, Y is an integer greater than 1, and N1>N2.

* * * * *